(12) United States Patent
Nguyen et al.

(10) Patent No.: US 6,958,927 B1
(45) Date of Patent: Oct. 25, 2005

(54) MAGNETIC ELEMENT UTILIZING SPIN-TRANSFER AND HALF-METALS AND AN MRAM DEVICE USING THE MAGNETIC ELEMENT

(75) Inventors: Paul P. Nguyen, San Jose, CA (US); Yiming Huai, Pleasanton, CA (US)

(73) Assignee: Grandis Inc., Milpitas, CA (US)

( * ) Notice: Subject to any disclaimer, the term of this patent is extended or adjusted under 35 U.S.C. 154(b) by 233 days.

(21) Appl. No.: 10/269,011

(22) Filed: Oct. 9, 2002

(51) Int. Cl.$^7$ .............................................. G11C 11/00
(52) U.S. Cl. ...................... 365/158; 365/171; 365/173; 257/295
(58) Field of Search ............................... 365/158, 171, 365/173; 257/295

(56) References Cited

U.S. PATENT DOCUMENTS

| | | | |
|---|---|---|---|
| 5,695,864 A | 12/1997 | Slonczewski | |
| 6,256,223 B1 | 7/2001 | Sun | |
| 6,532,164 B2 | 3/2003 | Redon et al. | |
| 6,639,291 B1 * | 10/2003 | Sin et al. | 257/427 |
| 6,721,149 B1 * | 4/2004 | Shi et al. | 360/324.2 |
| 6,747,301 B1 * | 6/2004 | Hiner et al. | 257/295 |
| 2002/0105827 A1 | 8/2002 | Redon et al. | |
| 2003/0007398 A1 | 1/2003 | Daughton et al. | |
| 2003/0059588 A1 | 3/2003 | Hannah et al. | |

OTHER PUBLICATIONS

F.J. Albert et al., Spin-polarized current switching of a Co thin film nanmagnet, Applied Physics Letters, vol. 77, No. 23, pp. 3809-3811, Dec. 4, 2004.

L. Berger, Emission of spin waves by a magnetic multilayer traversed by a current, Physical Review B, vol. 54, No. 13, pp. 9353-9358, Oct. 1, 1996.

J. Daughton, Magnetoresistive Random Access Memory (MRAM),Copyright Feb. 4, 2000.

J. Grollier et al., Spin-polarized current induced switching in Co/Cu/Co pillars, Applied Physics Letters, vol. 78, No. 25, pp. 3663, Jun. 4, 2001.

D. J Mapps et al., A Non-Volatile Solid-State Memory using the Magnetic Spin-Dependent-Tunnelling Effect, Datatech, pp. 25-28.

J.C. Slonczewski, Current-driven excitation of magnetic multilayers, Journal of Magnetism and Magnetic Materials 159(1996) L1-L7.

S. Soeya et al., Development of half-metallic ultrathin Fe3)4 films for spin-transport devices, Applied Physics Letters, vol. 80, No. 5, pp. 823-825, Feb. 4, 2002.

J.F. Albert, et al, "Polarized Current Switching of a CO Thin Film Nanomagnet", American Institute of Physics, vol. 77, No. 23, Dec. 4, 2000, pp. 3809-3811.

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

(Continued)

*Primary Examiner*—Son T. Dinh
(74) *Attorney, Agent, or Firm*—Sawyer Law Group LLP

(57) ABSTRACT

A magnetic element that can be used in a memory array having high density includes a pinned layer, a half-metallic material layer, a spacer (or a barrier) layer and a free layer. The half-metallic material layer is formed on the pinned layer and preferably has a thickness that is less than about 100 Å. The half-metallic material layer can be formed to be a continuous layer or a discontinuous on the pinned layer. The spacer (or barrier) layer is formed on the half-metallic material layer, such that the spacer (or barrier) layer is nonmagnetic and conductive (or insulating). The free layer is formed on the spacer (or barrier) layer and has a second magnetization that changes direction based on the spin-transfer effect when a write current passes through the magnetic element.

108 Claims, 10 Drawing Sheets

OTHER PUBLICATIONS

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczweski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

* cited by examiner

MAGNETIC ELEMENT UTILIZING SPIN-TRANSFER AND HALF-METALS AND AN MRAM DEVICE USING THE MAGNETIC ELEMENT

BACKGROUND OF THE INVENTION

1. Field of the Invention

The invention relates to magnetic memory systems. More particularly, the present invention relates to a method and system for providing an element that employs a spin-transfer effect in switching and that can be used in a magnetic memory, such as a magnetic random access memory ("MRAM").

2. Description of the Related Art

Magnetic memories are used for storing data. One type of memory element of interest utilizes magnetoresistance properties of a magnetic element for storing data. FIGS. 1A and 1B respectively depict cross sectional views of a conventional spin valve magnetic element 100 and a conventional spin tunneling junction magnetic element 100'. As shown in FIG. 1A, conventional spin valve magnetic element 100 includes a conventional antiferromagnetic (AFM) layer 102, a conventional pinned layer 104, a conventional spacer layer 106, and a conventional free layer 108. Conventional pinned layer 104 and conventional free layer 108 are ferromagnetic. Conventional spacer layer 106 is nonmagnetic and is conductive. AFM layer 102 is used to fix, or pin, the magnetization of the pinned layer 104 in a particular direction. The magnetization of free layer 108 is free to rotate, typically in response to an external field.

Portions of conventional spin tunneling junction magnetic element 100' are analogous to conventional spin valve magnetic element 100. Accordingly, conventional spin tunneling junction magnetic element 100' includes an AFM layer 102', a conventional pinned layer 104', an insulating barrier layer 106' and a free layer 108', as shown in FIG. 1B. Conventional barrier layer 106'is thin enough for electrons to tunnel through.

Depending upon the orientations of the magnetizations of free layer 108 (or 108') and pinned layer 104 (or 104'), the resistance of conventional magnetic element 100 (or 100) changes. For example, when the magnetizations of free layer 108 and pinned layer 104 are parallel, the resistance of conventional spin valve 100 is low. When the magnetizations of free layer 108 and pinned layer 104 are antiparallel, the resistance of conventional spin valve 100 is high. Similarly, when the magnetizations of free layer 108' and pinned layer 104' are parallel, the resistance of conventional spin tunneling junction 100' is low. When the magnetizations of free layer 108' and pinned layer 104' are antiparallel, the resistance of conventional spin tunneling junction 100' is high.

In order to sense the resistance of either conventional magnetic element 100 or 100', current is driven through the magnetic element. For conventional magnetic element 100, current can be driven through the magnetic element 100 in one of two configurations: current-in-plane (CIP) and current-perpendicular-to-the-plane (CPP). For conventional spin tunneling junction 100', however, current is driven through conventional spin tunneling junction 100'using only the CPP configuration. For the CIP configuration, current is driven parallel to the layers of conventional spin valve 100. Thus, as viewed in FIG. 1A, current is driven from left to right or right to left for the CIP configuration. For the CPP configuration, current is driven perpendicular to the layers of conventional magnetic element 100 (or 100'). Accordingly, as viewed in FIG. 1A or 1B, current is driven up or down for the CPP configuration. The CPP configuration is used in MRAM having a conventional spin tunneling junction 100' element in a memory cell.

FIG. 2 depicts a conventional memory array 200 using conventional memory cells 220. Each conventional memory cell 220 includes a conventional magnetic element 100 (or 100'). Conventional array 200 is shown having four conventional memory cells 220, which are typically spin tunneling junction magnetic elements 100'. As shown in FIG. 2, each memory cell 220 includes a conventional spin tunneling junction 100' and a transistor 222. Memory cells 220 are coupled to a reading/writing column selection 230 via bit lines 232 and 234 and to row selection 250 via word lines 252 and 254. Write lines 260 and 262, which are also depicted in FIG. 2, carry currents that generate external magnetic fields for the corresponding conventional memory cells 220 during writing. Reading/writing column selection 230 is coupled to a write current source 242 and a read current source 240, which are each coupled to a voltage supply $V_{dd}$ 248 via line 246.

In order to write to conventional memory array 200, a write current $I_w$ 242 is applied to bit line 232 (or 234), which is selected by reading/writing column selection 230. A read current $I_r$ 240 is not applied. Both word lines 252 and 254 are disabled, and transistors 222 in all memory cells 220 are disabled. Additionally, one of the write lines 260 and 262 corresponding to the selected memory cell 220 carries a current used to write to the selected memory cell. The combination of the current in write line 260 (or 262) and the current in bit line 232 (or 234) generates a magnetic field that is large enough to switch the direction of magnetization of free layer 108' of the selected cell and thus write to the selected cell. Depending upon the data written to the selected cell, the resulting resistance of the conventional magnetic tunneling junction 100' will be high or low. When reading from a selected cell 220 in array 200, a read current $I_r$ 240 is applied instead. The memory cell selected for reading is determined by row selection 250 and column selection 230. The output voltage of the selected cell is read at output line 244.

Although conventional magnetic memory 200 using conventional spin tunneling junctions 100' can function, there are obstacles at higher memory cell densities. In particular, conventional memory array 200 is written using an external magnetic field that is generated by currents driven through bit line 232 (or 234) and write line 260 (or 262). That is, the magnetization of free layer 108' is switched by the external magnetic field that is generated by currents driven through bit line 232 (or 234) and the write line 260 (or 262). The magnetic field required to switch the magnetization of free layer 108', known as the switching field, is inversely proportional to the width of the conventional magnetic element 100'. As a result, the switching field increases for conventional memories having smaller magnetic elements 100'. Because the switching field is higher for a smaller magnetic element 100', the required current that is to be driven through bit line 232 (or 234) and, in particular, through write line 260 (or 262) increases dramatically for a higher magnetic memory cell density. This relatively large current can cause a host of problems in a conventional magnetic memory array 200. For example, cross talk and power consumption increases accordingly. Additionally, the driving circuits required for driving the current that generates the switching field at a selected memory cell 220 also increase in physical area and complexity. Furthermore, the conventional write currents must be sufficiently large to switch a magnetic memory cell, but not so large that neighboring cells are inadvertently switched. The upper limit on the magnitude of the write current can lead to reliability issues because cells that are relatively harder to switch than others based on fabrication and material non-uniformity will fail to write consistently.

To overcome some of the obstacles associated with high-density magnetic memories described above, a recently discovered phenomenon, the spin-transfer effect, has been utilized. Details of the spin-transfer effect (and the spin-injection method) are disclosed in J. C. Slonczewski, "Current-driven Excitation of Magnetic Multilayers," Journal of Magnetism and Magnetic Materials, Vol. 159, pp. L1–L5 (1996); L. Berger, "Emission of Spin Waves by a Magnetic Multilayer Traversed by a Current," Phys. Rev. B, Vol. 54, p. 9353 (1996), and in F. J. Albert et al., "Spin-polarized Current Switching of a Co Thin Film Nanomagnet," Appl. Phys. Lett., vol. 77, No. 23, pp. 3809–3811 (2000), each of which is incorporated by reference herein.

The spin-transfer effect offers an alternative switching mechanism that has the advantage of being highly localized. In a multilayer structure consisting of ferromagnetic (or ferrimagnetic) layers that are separated by non-magnetic conducting spacer or an insulating barrier, spin transfer refers to the transferring of spin-angular momentum from the spin-polarized conduction electrons, via quantum-mechanical exchange field, into a ferromagnetic (or ferrimagnetic) layer when an electric current is driven across the multilayers. The spin-transfer effect causes the magnetization vector of the affected ferromagnetic layer to rotate. At high enough current, such a rotation can grow sufficiently large to produce switching (i.e. 180° of rotation). Successful application of the spin-transfer effect to magnetic switching has been demonstrated. Spin-transfer switching has been achieved in a simple giant-magnetoresistance (GMR) spin-transfer structure consisting of Co[thick]/Cu/Co[thin] layers where the Cu layer serves as a spacer separating the two magnetic layers. See, for example, F. J. Albert et al., "Spin-polarized current switching of a Co thin film nanomagnet," Appl. Phys. Lett., vol. 77, No. 23, pp. 3809–3811 (2000) and J. Grollier et al. "Spin-polarized current induced switching in Co/Cu/Co pillars," Applied Physics Letters, Vol. 78, No. 23, p. 3663–3665 (2001). If the thickness of the Cu layer is much less than the spin relaxation length, electrons traveling across the Cu layer retain much of their spin polarization. When electrons travel from the thick to the thin Co layer (with the current flowing in the opposite direction), the thick Co layer serves as a spin reservoir that injects spins into the thin Co layer. Transfer of spin-angular momentum causes the magnetization of the thin Co layer to align parallel to that of the thick Co layer.

When electrons travel from the thick to the thin Co layer, on the other hand, electrons having spins that are parallel to the magnetization direction of the thick Co layer pass without much scattering through the thick Co, but electrons having antiparallel spins are reflected. The reflected antiparallel spins cause the magnetization of the thin Co layer to align antiparallel to the magnetization of the thick Co layer. Thus, by changing the flow direction of the spin-polarized current, the magnetization of the thin Co layer can be repeatedly switched to be parallel and antiparallel.

The spin-transfer effect can be used in a CPP configuration as an alternative to or in addition to using an external switching field to switch the direction of magnetization of free layer 108 (or 108') of a conventional spin valve 100 (or a conventional spin tunneling junction 100'). The spin-transfer effect dominates other mechanisms and thus becomes observable when the dimensions of conventional magnetic element 100 (or 100') are small, in the range of few hundred nanometers. Consequently, the spin-transfer effect is suitable for higher density magnetic memories having smaller magnetic elements 100 (or 100').

For example, switching the magnetization of a conventional free layer 108 in conventional spin valve 100 using spin transfer can be carried out as follows. Current can be driven from conventional free layer 108 to conventional pinned layer 104 to switch the magnetization of conventional free layer 108 so that it is parallel to the magnetization of conventional pinned layer 104. The magnetization of conventional free layer 108 is assumed to be initially antiparallel to conventional pinned layer 104. When current is driven from conventional free layer 108 to conventional pinned layer 104, conduction electrons travel from conventional pinned layer 104 to conventional free layer 108. The majority electrons traveling from conventional pinned layer 104 have their spins polarized in the same direction as the magnetization of conventional pinned layer 104 and interact with the magnetic moments of conventional free layer 108 near the interface between conventional free layer 108 and conventional spacer layer 106. As a result, the electrons transfer their spin-angular momentum to conventional free layer 108. Thus, angular momentum corresponding to spins that are antiparallel to the magnetization of conventional free layer 108 (and parallel to conventional pinned layer 104) is transferred to the conventional free layer. If the electrons transfer sufficient angular momentum, the magnetization of conventional free layer 108 is switched to be parallel to the magnetization of conventional free layer 104.

Alternatively, current can be driven from conventional pinned layer 104 to conventional free layer 108 to switch the magnetization of conventional free layer 108 to be antiparallel to the magnetization of conventional pinned layer 104. In this situation, the magnetization of free layer 108 is assumed to be initially parallel to the magnetization of pinned layer 104. When current is driven from conventional pinned layer 104 to conventional free layer 108, conduction electrons travel in the opposite direction. The majority electrons have their spins polarized in the direction of magnetization of conventional free layer 108, which is originally magnetized in the same direction as conventional pinned layer 104. The majority electrons are transmitted through conventional pinned layer 104. The minority electrons, however, which have spins that are polarized antiparallel to the magnetization of conventional free layer 108 and conventional pinned layer 104, will be reflected from conventional pinned layer 104 and travel back to conventional free layer 108. The minority electrons reflected by conventional pinned layer 104 interact with magnetic moments of conventional free layer 108 and transfer at least a portion of their spin-angular momentum to conventional free layer 108. If the electrons transfer sufficient angular momentum to conventional free layer 108, the magnetization of free layer 108 is switched to be antiparallel to the magnetization of conventional pinned layer 104.

In the CPP configuration, therefore, a current driven through a conventional magnetic element 100 (or 100') can switch the direction of magnetization of free layer 108 (or 108') using the spin-transfer effect. That is, the spin-transfer effect can be used to write to magnetic element 100 (or 100') in a magnetic memory by driving a current through a conventional magnetic element 100 (or 100') in a CPP configuration. Thus, writing using the spin-transfer effect is more localized and, consequently, generates less cross talk. Spin-transfer effect is also more reliable because spin-transfer results in a high effective field in a conventional magnetic element 100 (or 100') in a device, such as MRAM. Additionally, for a magnetic element 100 (or 10') having a small enough size, the current required to switch the magnetization using the spin-transfer effect can be significantly less than the current required to generate a switching field in conventional magnetic memory array 200. Accordingly, there is less power consumption when writing.

Although the spin-transfer effect can be advantageously used to switch the direction of the magnetization of conventional free layer 108 (or 108'), there are barriers to using the spin-transfer effect for a conventional magnetic element 100 (or 100') in a memory. For a conventional spin valve magnetic element 100, the CPP configuration results in a significantly reduced signal. For example, the magnetoresistance ratio for the CPP configuration of a conventional spin valve 100 is only approximately two percent. Moreover, the total resistance of a conventional spin valve magnetic element 100 is low. Thus, the read signal output by a conventional spin valve magnetic element 100 is very low. Consequently, although the spin-transfer effect can be used to write to a conventional spin valve magnetic element 100, the output signal when reading from the conventional spin valve 100 is so low that it is difficult to use a conventional spin valve magnetic element 100 in a magnetic memory that is written using the spin-transfer effect.

On the other hand, a conventional spin tunneling junction magnetic element 100' has a large resistance-area product (Ra) that is typically on the order of k$\Omega$ $\mu m^2$. The high current density that is required for inducing the spin-transfer effect, however, could destroy the thin insulating barrier due to ohmic dissipation. Moreover, the spin-transfer effect has not been observed in a conventional spin tunneling junction magnetic element 100' at room temperature. Thus, an MRAM having conventional spin tunneling junction magnetic elements 100' that have a high Ra value may not be able to be used with the spin-transfer effect for writing to the magnetic memory cells.

As used herein, the term "spin-transfer stack" is defined to be any two-terminal multilayer structure that utilizes the spin-transfer effect for switching the magnetization of a ferromagnetic (ferrimagnetic or sperimagnetic) layer. The term "two-terminal multilayer structure (or device)", as used herein, is defined to be a multilayer structure (or device) that has one bottom lead in contact with a bottom layer of a multilayer structure and one top lead in contact with a top layer of the multilayer structure, and with current driven between the bottom and top lead through the multilayer structure. In contrast, U.S. Pat. No. 5,695,864 to Slonczewski discloses a three-terminal device using spin-transfer for switching. The structure and operational principles of such a three terminal device are different from the spin-transfer stack devices described herein. All spin-transfer stack devices referred to herein will be assumed to be two-terminal, unless otherwise noted.

To date, several types of two-terminal spin-transfer stack devices have been proposed. A first type of two-terminal spin-transfer stack device is referred to herein as a single-spacer spin-transfer stack device. A second type of two-terminal spin-transfer stack device is referred to herein as a single-barrier & dual barrier spin-transfer stack device. A third type of two-terminal spin-transfer stack device is referred to herein as a spacer-barrier spin-transfer stack device.

An exemplary single-spacer spin-transfer stack device is formed having a fixed magnetic layer/Cu spacer/Free magnetic layer. Variations of a single-spacer spin-transfer stack device include additions of antiferromagnetic layers for pinning and synthetic layers (such as CoFe[20A]/Ru[8.4A]/CoFe[22A]) for reducing magnetostatic coupling between the layers. The single-spacer spin-transfer stack type suffers numerous disadvantages, including an extremely small signal, a low resistance, and a high switching current.

An exemplary single-barrier stack device is formed having a Fixed magnetic layer/Tunnel barrier/Free magnetic nanoparticle. See, for example, U.S. Pat. No. 6,256,223 to Sun. An exemplary dual-barrier stack device is formed having a Fixed magnetic layer/Tunnel barrier/Free magnetic nanoparticle/Tunnel barrier/Fixed magnetic layer. See, for example, U.S. Pat. No. 6,256,223 to Sun. Variations to this type of two-terminal spin-transfer stack device include additions of antiferromagnetic layers for pinning and synthetic layers for reducing magnetostatic coupling between the layers. The single-barrier and dual-barrier spin-transfer stack devices suffer from numerous disadvantages, including an extremely high resistance, a high switching current, an unreliable method of fabrication, and a lack of working experimental evidence of spin-transfer effect switching across tunnel barrier(s) at room temperature.

An exemplary spacer-barrier stack device is formed having a Fixed magnetic layer/Conducting spacer/Free magnetic layer/Low-resistance tunnel barrier/Fixed magnetic layer. See, for example, copending and co-assigned U.S. patent application Ser. No. 10/213,537, filed Aug. 6, 2002, entitled Off-Axis Pinned Layer Magnetic Element Utilizing Spin Transfer And An MRAM Device Using The Magnetic Element, which is incorporated by reference herein. Variations to a spacer-barrier spin-transfer stack device include additions of antiferromagnetic layers for pinning and synthetic layers for reducing magnetostatic coupling between the layers. The spacer-barrier stack types address most of the problems of the other spin-transfer stack types. The low-resistance tunnel barrier significantly increases the read signal, but yet keeps the total stack resistance low. Unlike spin-transfer switching across a tunnel barrier, spin-transfer switching across a conducting spacer at room temperature has been experimentally observed. Consequently, a spacer-barrier spin-transfer stack is guaranteed to switch because it contains a conducting spacer arrangement.

Giant magnetoresistive (GMR) and tunnel magnetoresistive (TMR) ratios are strongly dependent on the spin polarization P of the magnetic layers. Spin polarization P can be defined straightforwardly as the percentage of up (down) spins minus the percentage of down (up) spins in a ferromagnetic material at the Fermi level. Most common magnetic materials, such as Fe, Co, Ni and their alloys have a rather low P of less than 50%. Half-metals are ferromagnets having a very high P (approaching 100%) that are metallic in one spin orientation and insulating in the other spin orientation. Because of their potential application to GMR and TMR devices, half-metals recently have been actively researched. Some half-metallic materials that have been discovered are $CrO_2$, $Sr_2FeMoO_6$, $(La0.7Sr0.3)MnO_3$, $Fe_3O_4$, and NiMnSb, of which $Fe_3O_4$ has the highest Curie temperature resulting in very high spin polarization P at room temperature.

The low spin-polarization materials have a significant number of minority spins that have an orientation that is opposite to that of the majority spins, despite a display of permanent magnetization. When these low spin-polarization materials are used in magnetic layers in a spin-transfer stack, the spin-transfer effect is reduced as the transferred angular momentum from the minority spins negates much of the transferred angular momentum from the majority spins. As a result, the switching current must be large to induce switching. On the other hand, when high spin-polarization half-metallic materials are used as magnetic layers in a spin-transfer stack, the opposing angular momentum negation from the small (theoretically zero for a perfect half-metal) number of minority spins is also small, resulting in a small switching current requirement. The decrease in the switching current can be significant, i.e., by more than a factor of 5, when going from materials of spin polarization of 35% to materials of spin polarization of 80% assuming coherent electron scattering in the free magnetic layer. See, for example, J. C. Slonczewski, "Current-driven excitation of magnetic multilayers," Journal of Magnetism and Magnetic Materials, Vol. 159, L1–L7 (1995).

Previously, half-metals have been introduced, at least conceptually, for improving performance of spin valves and spin tunneling junctions. Typical improvement goals for the introduction of half-metals have been higher GMR and TMR ratios. Half-metals can be introduced in various forms, such as a total replacement of all non-half-metallic ferromagnetic layers, a partial replacement, a thin coating at the appropriate interfaces between the layers, and as thin film insertion within ferromagnetic layers. Introduction of half-metals to spin valves and spin tunneling junctions, however, provide devices that do not involve spin-transfer switching or writing.

Partial introduction of half-metals to single-spacer spin-transfer stack has also been proposed previously. U.S. Pat. No. 5,696,864 to Slonczewski discloses that all of the pinned and/or free magnetic layers in a single-spacer spin-transfer stack device can be replaced with high spin-polarization or half-metallic magnetic materials. Replacing a magnetic layer with a high spin-polarization of half-metallic material, though, can lead to problems related to the material characteristics of the new material. For instance, if the half-metallic material, such as $Fe_3O_4$, has extremely high resistivity, the total resistance of the spin-transfer stack would be extremely high, thereby resulting in a very small signal. The half-metallic material may also have large surface roughness that would affect the other layers in the spin-transfer stacks. Finally, if the half-metallic material has high magnetic anisotropy and coercivities (e.g., greater than 1000 Oe), the half-metallic material cannot be practically used for replacing the free layer.

Nevertheless, all of the spin-transfer stacks described above suffer from a high switching current. Consequently, what is needed is a way to reduce the high switching current exhibited by a conventional spin-transfer stack. Additionally, what is still needed is a magnetic memory element that can be used in a memory array having high density, that provides low power consumption, low cross talk, and has high reliability, while providing a useable read signal.

BRIEF SUMMARY OF THE INVENTION

The present invention provides a way to reduce the high switching current exhibited by a conventional spin-transfer stack. The present invention also provides a magnetic memory element that can be used in a memory array having high density, that provides low power consumption, low cross talk, and has high reliability, while providing a useable read signal. To achieve these advantages, the present invention replaces and/or inserts half-metallic materials into a spin-transfer stack.

The advantages of the present invention are provided by a first embodiment of a magnetic element that includes a pinned layer, a half-metallic material layer and a free layer. The pinned layer can be formed from a ferromagnetic or a ferrimagnetic material, or a half-metallic material with a first magnetization that is pinned in a first direction. The half-metallic material layer is formed on the pinned layer from, for example, $Fe_3O_4$, $CrO_2$, $Sr_2FeMoO_6$, $(La0.7Sr0.3)MnO_3$, or NiMnSb. Preferably, the half-metallic material layer has a thickness that is less than about 100 Å. When the pinned layer is formed from a half-metallic material, the half-metallic material is preferably the same as that of the half-metallic layer, and then the pinned layer and the half-metallic material layer together form a single layer of the half-metallic material. The half-metallic material layer can be formed to be a continuous layer or a discontinuous on the pinned layer. The spacer layer is formed on the half-metallic material layer, such that the spacer layer is nonmagnetic and conductive. The free layer is formed on the spacer layer and has a second magnetization that changes direction based on the spin-transfer effect when a write current passes through the magnetic element. The free layer is formed from a ferromagnetic material or a half-metallic material, such as $Fe_3O_4$, $CrO_2$, $Sr_2FeMoO_6$, $(La0.7Sr0.3)MnO_3$, or NiMnSb. Accordingly, the first embodiment of the present invention can be used in a magnetic memory device having a plurality of magnetic elements according to the present invention.

A first alternative embodiment of the first embodiment of the present invention further includes a second spacer layer, a second half-metallic material layer and a second pinned layer. The second spacer layer is formed on the free layer, and is nonmagnetic and conductive. The second half-metallic material layer is formed on the second spacer layer and is formed from, for example, $Fe_3O_4$, $CrO_2$, $Sr_2FeMoO_6$, $(La0.7Sr0.3)MnO_3$, or NiMnSb. Preferably, the second half-metallic layer has a thickness that is less than about 100 Å, and can be formed to be a continuous layer or a discontinuous layer. The second pinned layer is formed on the second half-metallic layer, and has a third magnetization that is pinned in a direction that is different from the first direction. The second pinned layer can be formed from a ferromagnetic material or a half-metallic material. When the second pinned layer is formed from a half-metallic material, the half-metallic material is preferably the same as that of the half-metallic layer, and the second pinned layer and the second half-metallic layer together thus form a single layer.

A second alternative embodiment of the first embodiment of the present invention further includes a barrier layer, a second half-metallic material layer and a second pinned layer. The barrier layer is formed on the free layer, and is an insulator having a thickness that allows tunneling through the barrier layer. The second half-metallic material layer is formed on the barrier layer and is formed from, for example, $Fe_3O_4$, $CrO_2$, $Sr_2FeMoO_6$, $(La0.7Sr0.3)MnO_3$, or NiMnSb. Preferably, the second half-metallic layer has a thickness that is less than about 100 Å, and can be formed to be a continuous layer or a discontinuous layer. The second pinned layer is formed on the second half-metallic layer, and has a third magnetization that is pinned in a direction that is different from the first direction. The second pinned layer can be formed from a ferromagnetic material or a half-metallic material. When the second pinned layer is formed from a half-metallic material, the half-metallic material is preferably the same as that of the half-metallic layer, and then the pinned layer and the half-metallic material layer together form a single layer of the half-metallic material.

A second embodiment of the present invention provides a magnetic element having a pinned layer, a half-metallic material layer, a barrier layer and a free layer. The pinned layer has a first magnetization that is pinned in a first direction; and can be formed from a ferromagnetic material or a half-metallic material, such as $Fe_3O_4$, $CrO_2$, $Sr_2FeMoO_6$, $(La0.7Sr0.3)MnO_3$, or NiMnSb. The half-metallic material layer is formed on the pinned layer. Preferably, the half-metallic material layer has a thickness that is less than about 100 Å, and can be formed from, for example, $Fe_3O_4$, $CrO_2$, $Sr_2FeMoO_6$, $(La0.7Sr0.3)MnO_3$, or NiMnSb. When the pinned layer is formed from a half-metallic material, the half-metallic material is preferably the same as that of the half-metallic layer, and then the pinned layer and the half-metallic material layer together form a single layer of the half-metallic material. The half-metallic material layer can be formed to be a continuous layer or a discontinuous layer. The barrier layer is formed on the half-metallic material layer, and is an insulator having a thickness that allows tunneling through the barrier layer. The free layer is formed on the barrier layer, and has a second magnetization that changes direction based on the spin-transfer effect when a write current passes through the magnetic element. The free layer is formed from a ferromagnetic material or a half-metallic material, such as $Fe_3O_4$, $CrO_2$, $Sr_2FeMoO_6$, $(La0.7Sr0.3)MnO_3$, or NiMnSb. Accordingly, the second embodiment of the present invention can be used in a magnetic memory device having a plurality of magnetic elements according to the present invention.

A first alternative embodiment of the second embodiment of the present invention further includes a second barrier layer, a second half-metallic material layer and a second pinned layer. The second barrier layer is formed on the free layer, and is an insulator having a thickness that allows tunneling through the second barrier layer. The second half-metallic material layer formed on the second barrier layer as either a continuous layer or a discontinuous layer. Preferably, the second half-metallic material layer has a thickness that is less that about 100 Å, and is formed from, for example, $Fe_3O_4$, $CrO_2$, $Sr_2FeMoO_6$, $(La0.7Sr0.3)MnO_3$, or NiMnSb. The second pinned layer is formed on the second half-metallic layer, and has a third magnetization that is pinned in a direction that is different from the first direction. The second pinned layer can be formed from a ferromagnetic material or a half-metallic material. When the second pinned layer is formed from a half-metallic material, the half-metallic material is preferably the same as that of the half-metallic layer, and the second pinned layer and the second half-metallic layer together thus form a single layer. Suitable half-metallic materials that can form the second pinned layer include $Fe_3O_4$, $CrO_2$, $Sr_2FeMoO_6$, $(La0.7Sr0.3)MnO_3$, and NiMnSb.

A second alternative embodiment of the second embodiment of the present invention includes a spacer layer, a second half-metallic material layer and a second pinned layer. The spacer layer is formed on the free layer, and is nonmagnetic and conductive. The second half-metallic material layer is formed on the second spacer layer and is formed from, for example, $Fe_3O_4$, $CrO_2$, $Sr_2FeMoO_6$, $(La0.7Sr0.3)MnO_3$, or NiMnSb. Preferably, the second half-metallic layer has a thickness that is less than about 100 Å, and can be formed to be a continuous layer or a discontinuous layer. The second pinned layer is formed on the second half-metallic layer, and has a third magnetization that is pinned in a direction that is different from the first direction. The second pinned layer can be formed from a ferromagnetic material or a half-metallic material. When the second pinned layer is formed from a half-metallic material, the half-metallic material is preferably the same as that of the half-metallic layer, and then the second pinned layer and the half-metallic material layer together form a single layer of the half-metallic material.

A third embodiment of the present invention provides a method for forming a magnetic element that includes a pinned layer having a first magnetization that is pinned in a first direction. A half-metallic material layer is formed on the pinned layer. A spacer layer is formed on the half-metallic material layer, such that the spacer layer is nonmagnetic and conductive. A free layer is formed on the spacer layer, such that the free layer has a second magnetization that changes direction based on the spin-transfer effect when a write current passes through the magnetic element. According to the invention, the half-metallic material layer can be formed from one of $Fe_3O_4$, $CrO_2$, $Sr_2FeMoO_6$, $(La0.7Sr0.3)MnO_3$, and NiMnSb, and has a thickness that is less than about 100 Å. Further, the half-metallic material layer can be a continuous layer or a discontinuous layer on the pinned layer.

A first alternative embodiment of the third embodiment of the present invention further includes a step of forming a second spacer layer on the free layer, such that the second spacer layer is nonmagnetic and conductive. A second half-metallic material layer is formed on the second spacer layer and preferably has a thickness that is less than about 100 Å. The second half-metallic material layer can be formed from $Fe_3O_4$, $CrO_2$, $Sr_2FeMoO_6$, $(La0.7Sr0.3)MnO_3$, or NiMnSb, and can be either a continuous layer or a discontinuous layer A second pinned layer is formed on the second half-metallic layer, such that the second pinned layer has a third magnetization that is pinned in a direction that is different from the first direction.

A second alternative embodiment of the third embodiment of the present invention further includes a step of forming a barrier layer on the free layer, such that the barrier layer is an insulator and has a thickness that allows tunneling through the barrier layer. A second half-metallic material layer is formed on the barrier layer from, for example, $Fe_3O_4$, $CrO_2$, $Sr_2FeMoO_6$, $(La0.7Sr0.3)MnO_3$, or NiMnSb. Preferably, the second half-metallic material layer has a thickness that is less than about 100 Å, and can be formed to be a continuous layer or a discontinuous layer. A second pinned layer is formed on the second half-metallic layer, the second pinned layer having a third magnetization that is pinned in a direction that is different from the first direction.

A fourth embodiment of the present invention provides a method for forming a magnetic element that includes a pinned layer having a first magnetization that is pinned in a first direction. A half-metallic material is formed layer on the pinned layer. A barrier layer is on the half-metallic material layer, such that the barrier layer is an insulator and has a thickness that allows tunneling through the barrier layer. A free layer is formed on the barrier layer, such that the free layer has a second magnetization that changes direction based on the spin-transfer effect when a write current passes through the magnetic element. According to the invention, the half-metallic material layer can be formed from one of $Fe_3O_4$, $CrO_2$, $Sr_2FeMoO_6$, $(La0.7Sr0.3)MnO_3$, and NiMnSb, and has a thickness that is less than about 100 Å. Further, the half-metallic material layer can be a continuous layer or a discontinuous layer on the pinned layer.

A first alternative embodiment of the fourth embodiment of the present invention further includes a step of forming a second barrier layer on the free layer, such that the second barrier layer is an insulator and has a thickness that allows tunneling through the barrier layer. A second half-metallic material layer is formed on the second barrier layer from, for example, $Fe_3O_4$, $CrO_2$, $Sr_2FeMoO_6$, $(La0.7Sr0.3)MnO_3$, or NiMnSb. Preferably, the second half-metallic material layer has a thickness that is less than about 100 Å, and can be formed to be a continuous layer or a discontinuous layer. A second pinned layer is formed on the second half-metallic layer, the second pinned layer having a third magnetization that is pinned in a direction that is different from the first direction.

A second alternative embodiment of the fourth embodiment of the present invention further includes a step of forming a spacer layer on the free layer, such that the spacer layer is nonmagnetic and conductive. A second half-metallic material layer is formed on the spacer layer and preferably has a thickness that is less than about 100 Å. The second half-metallic material layer can be formed from $Fe_3O_4$, $CrO_2$, $Sr_2FeMoO_6$, $(La0.7Sr0.3)MnO_3$, or NiMnSb, and can be either a continuous layer or a discontinuous layer A second pinned layer is formed on the second half-metallic layer, such that the second pinned layer has a third magnetization that is pinned in a direction that is different from the first direction.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE INVENTION

The present invention provides a spin-transfer stack device that has a reduced switching current and that can be used in a memory array having high density. Further, a spin-transfer stack device of the present invention provides low power consumption, low cross talk, and has high reliability, while providing a useable read signal. To achieve these and other advantages, the present invention provides different types of spin-transfer stack devices that replace magnetic layers with layers of a half-metallic material and/or use a continuous or a discontinuous layer of a half-metallic material on the magnetic layers.

One exemplary embodiment of the present invention provides a single-spacer spin-transfer stack device that uses thin coating of a half-metallic material that is approximately 100 Å thick or less that is deposited on top of the pinned layer, thereby reducing the effects of the undesirable material characteristics and still keep the high polarization.

Figure 3A:
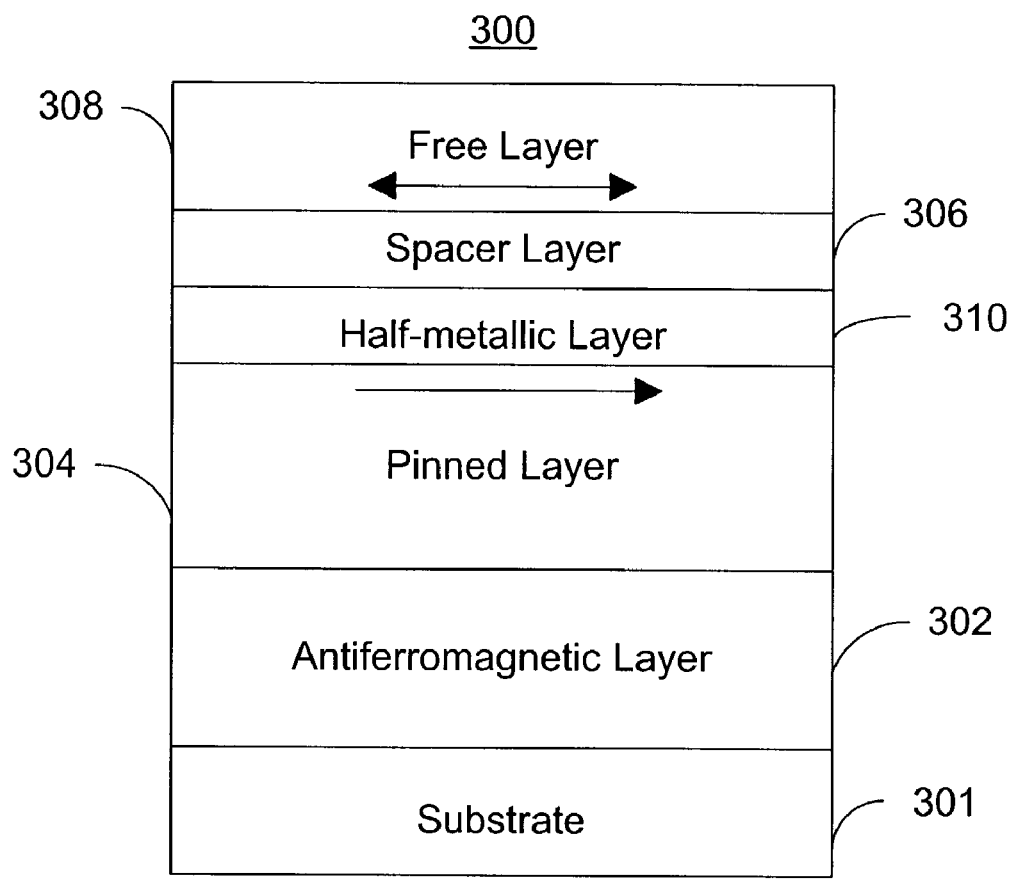
FIGS. 3A and 3B respectively depict cross sectional views of an exemplary single-spacer spin-transfer stack device and an exemplary dual-spacer spin-transfer stack device according to the present invention.
Figure 3B:
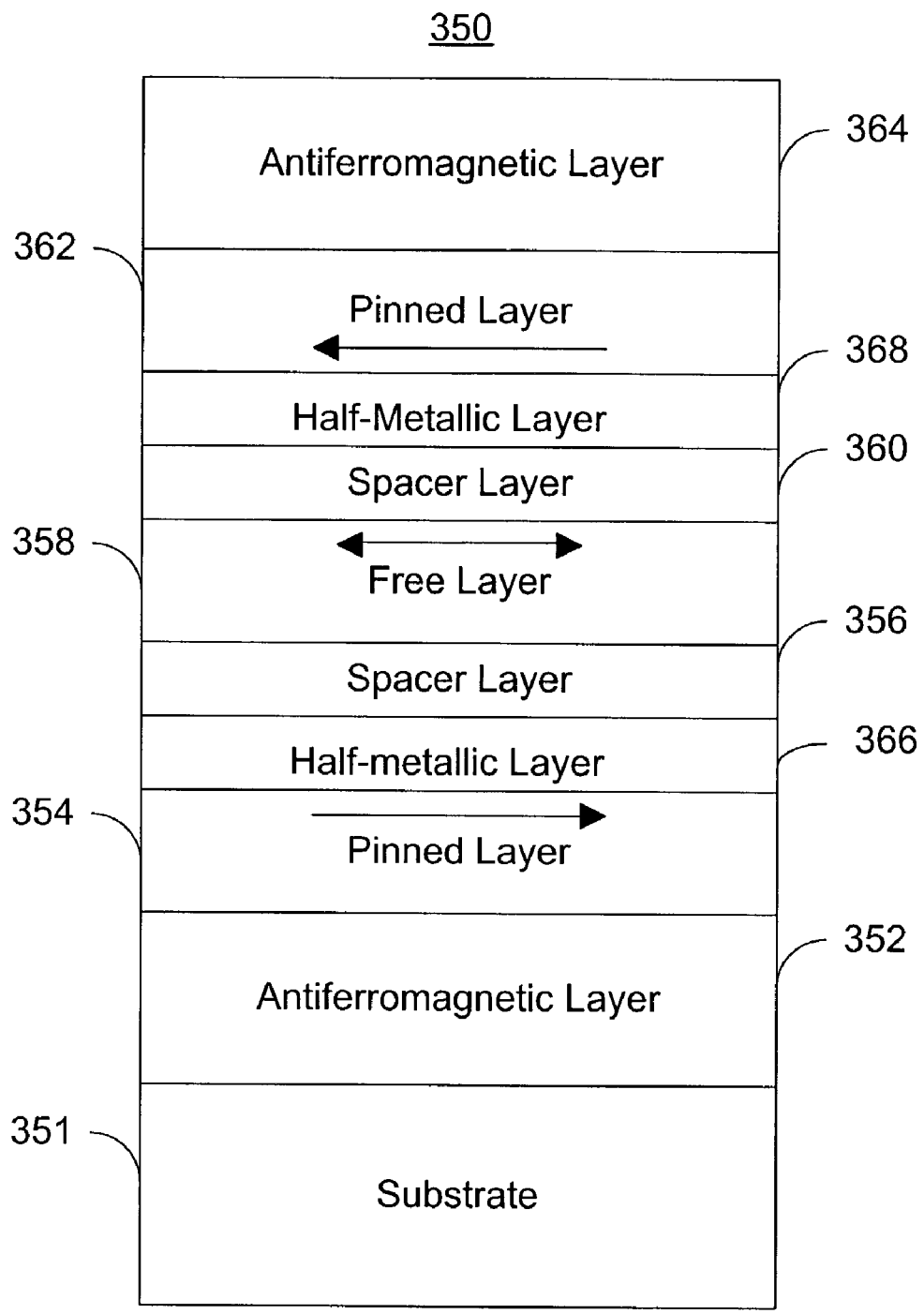

FIGS. 3A and 3B respectively depict cross sectional views of an exemplary single-spacer spin-transfer stack device 300 and an exemplary dual-spacer spin-transfer stack device 350 according to the present invention. Single-spacer spin-transfer stack device 300 is formed on a substrate 301 and includes an antiferromagnetic (AFM) layer 302, a pinned layer 304, a spacer layer 306, and a free layer 308. According to this exemplary embodiment of the invention, single-spacer spin-transfer stack device 300 includes a half-metallic material layer 310 that has been formed between pinned layer 304 and spacer layer 306 and is approximately 100 Å thick or less. As the thickness of layer 310 decreases, layer 310 may change from a continuous layer to a discontinuous layer that resembles a dusting of the half-metallic material between pinned layer 304 and spacer layer 306. A thin discontinuous half-metallic material layer 310 is also suitable for this exemplary embodiment of the present invention. Pinned layer 304 and free layer 308 are formed from a ferromagnetic or a ferrimagnetic material. Spacer layer 306 is formed from a nonmagnetic, conductive material, such as Cu, Ag or Au, and is about 20–60 Å thick. AFM layer 302 is used to fix, or pin, the magnetization of pinned layer 304 in a particular direction. The magnetization of free layer 308 is free to rotate, typically in response to an external field.

In FIG. 3B, exemplary dual-spacer spin-transfer stack device 350 is formed on a substrate 351 and includes a first antiferromagnetic (AFM1) layer 352, a first pinned layer 354, a first spacer layer 356, a free layer 358, a second spacer layer 360, a second pinned layer 362 and a second antiferromagnetic (AFM2) layer 364. According to this exemplary embodiment of the invention, dual-spacer spin-transfer stack device 450 includes a first half-metallic material layer 366 that has been formed between pinned layer 354 and first spacer layer 356 and is approximately 100 Å thick or less. A second half-metallic material layer 368 has also been formed between second spacer layer 360 and second pinned layer 362, and is approximately 100 Å thick or less. One or both of half-metallic material layers 366 and 368 can be formed to be a continuous layer for this exemplary embodiment of the present invention. Alternatively, one or both of half-metallic material layers 366 and 368 can be formed to be a discontinuous layer. Pinned layers 354 and 362 and free layer 358 are formed from a ferromagnetic or a ferrimagnetic material. Spacer layers 356 and 360 are formed from a nonmagnetic, conductive material, such as Cu, Ag or Au, and are each about 20–60 Å thick. AFM layers 352 and 364 are used to respectively fix, or pin, the magnetization of pinned layers 354 and 362 in a particular direction. The magnetization of free layer 358 is free to rotate, typically in response to an external field.

A suitable half-metallic material to use for half-metallic material layer 310 of single-spacer spin-transfer stack device 300 and for half-metallic material layers 366 and 368 of dual-spacer spin-transfer stack device 350 is $Fe_3O_4$, which has a very high polarization factor at room temperature because of its high Curie temperature of 860 degrees Celsius. Other suitable half-metallic materials that can be used include $CrO_2$, $Sr_2FeMoO_6$, $(La0.7Sr0.3)MnO_3$, and NiMnSb. The high polarization of $Fe_3O_4$ helps reduce the switching current of free layer 308 (358). As the conductivity of $Fe_3O_4$ is based on electron hopping, $Fe_3O_4$ thin films have high resistivity of around 10 mOhm-cm. Consequently, the resistance of an $Fe_3O_4$ pinned layer or coating on the pinned layer dominates in both a single-spacer spin-transfer stack and a dual-spacer spin-transfer stack, thereby resulting in a minute giant magnetoresistance (GMR) signal for both a single-spacer spin-transfer stack device and a dual-spacer spin-transfer stack device, such as devices 300 and 350.

In exemplary alternative embodiments of the single-spacer spin-transfer stack device and the dual-spacer spin-transfer stack device of the present invention, a half-metallic material can replace all or some of the magnetic layers, including the pinned layers and the free layers. In the alternative embodiments in which a half-metallic material replaces the free layer, a half-metallic material layer is formed between the pinned layer and the spacer. In yet additional exemplary alternative embodiments, a thin coating(s) of a half-metallic material can be used at the interface (s) between a pinned layer and an adjacent barrier layer in each of the embodiments of the single-spacer spin-transfer stack device and the dual-spacer spin-transfer stack device of the present invention.

Figure 4A:
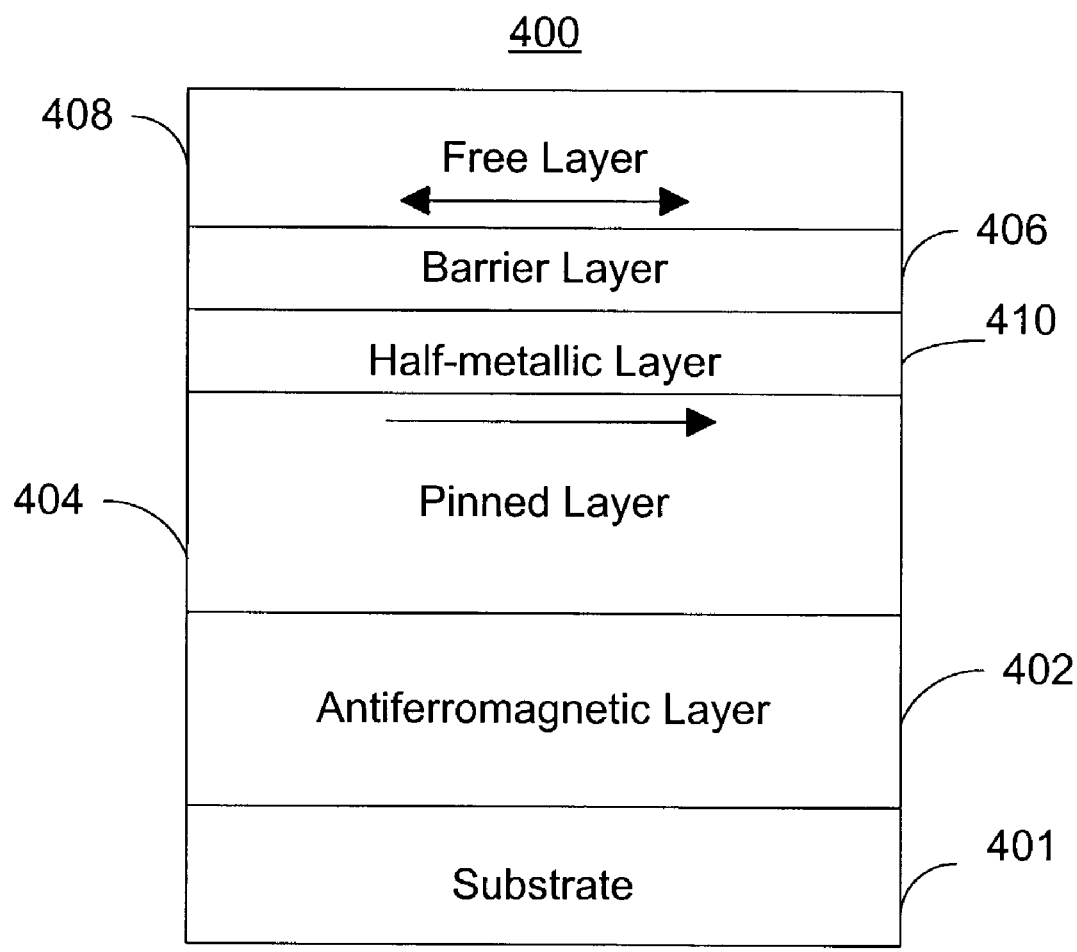
FIGS. 4A and 4B respectively depict cross sectional views of an exemplary single-barrier spin-transfer stack device and an exemplary dual-barrier spin-transfer stack device according to the present invention.
Figure 4B:
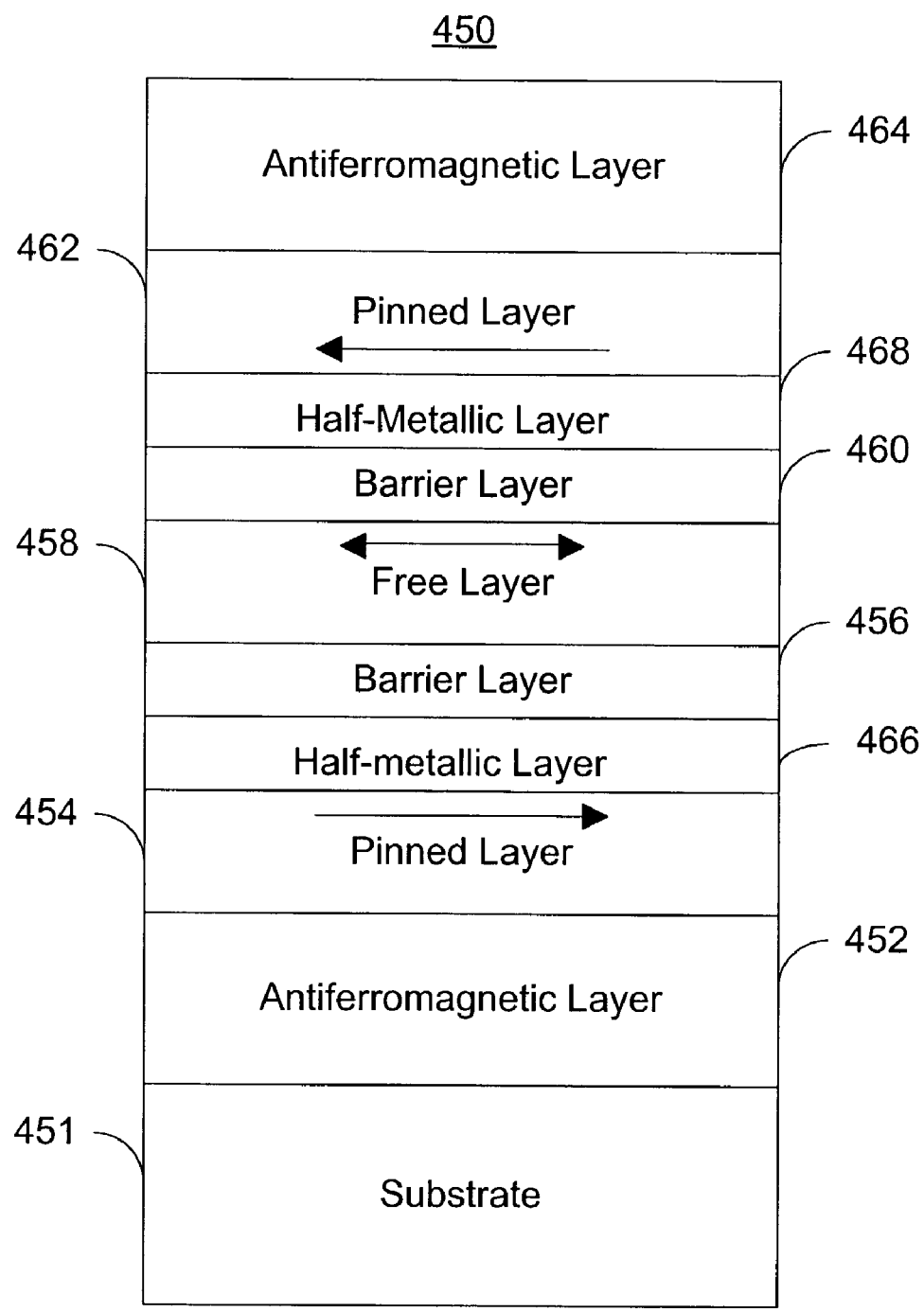

FIGS. 4A and 4B respectively depict cross sectional views of an exemplary single-barrier spin-transfer stack device 400 and an exemplary dual-barrier spin-transfer stack device 450 according to the present invention. In FIG. 4A, exemplary single-barrier spin-transfer stack device 400 is formed on a substrate 401 and includes an antiferromagnetic (AFM) layer 402, a pinned layer 404, a barrier layer 406, and a free layer 408. According to this exemplary embodiment of the invention, single-barrier spin-transfer stack device 400 includes a half-metallic material layer 410 that has been formed between pinned layer 404 and barrier layer 406 and is approximately 100 Å thick or less. As the thickness of layer 410 decreases, layer 410 may change from a continuous layer to a discontinuous layer that resembles a dusting of the half-metallic material between pinned layer 404 and barrier layer 406. A thin discontinuous half-metallic material layer 410 is also suitable for this exemplary embodiment of the present invention. Pinned layer 404 and free layer 408 are formed from a ferromagnetic or a ferrimagnetic material. Barrier layer 406 is formed from an insulator, such as alumina $Al_2O_3$ or other non-magnetic insulator, and has a thickness less than about 10 Å thereby allowing tunneling through barrier layer 406. The thickness of tunneling barrier layer 406 is adjusted so that the resistance across the tunneling barrier is sufficiently small. AFM layer 402 is used to fix, or pin, the magnetization of the pinned layer 404 in a particular direction. The magnetization of free layer 408 is free to rotate, typically in response to an external field.

In FIG. 4B, exemplary dual-barrier spin-transfer stack device 450 is formed on a substrate 451 and includes a first antiferromagnetic (AFM1) layer 452, a first pinned layer 454, a first barrier layer 456, a free layer 458, a second barrier layer 460, a second pinned layer 462 and a second antiferromagnetic (AFM2) layer 464. According to this exemplary embodiment of the invention, dual-barrier spin-transfer stack device 450 includes a first half-metallic material layer 466 that has been formed between pinned layer 454 and first barrier layer 456 and is approximately 100 Å thick or less. A second half-metallic material layer 468 has also been formed between second barrier layer 460 and second pinned layer 462, and is approximately 100 Å thick or less. One or both of half-metallic material layers 466 and 468 can be formed to be a continuous layer. Alternatively, one or both of half-metallic material layers 466 and 468 can be formed to be a discontinuous layer. Pinned layers 454 and 462 and free layer 458 are formed from a ferromagnetic or a ferrimagnetic material. Barrier layers 456 and 460 are formed from insulators, such as alumina $Al_2O_3$ or other non-magnetic insulators, and each have a thickness less than about 10 Å, thereby allowing tunneling through each respective barrier layer. The thicknesses of tunneling barrier layers 456 and 460 are adjusted so that the resistance across the each tunneling barrier is sufficiently small. AFM layers 452 and 464 are used to respectively fix, or pin, the magnetization of pinned layers 454 and 462 in a particular direction. The magnetization of free layer 458 is free to rotate, typically in response to an external field.

A suitable half-metallic material to use for half-metallic material layer 410 of single-barrier spin-transfer stack device 400 and for half-metallic layers 466 and 468 for a dual-barrier spin-transfer stack device 450 according to the present invention is $Fe_3O_4$, although different half-metallic materials can be used at each interface. Other suitable half-metallic materials that can be used include $CrO_2$, $Sr_2FeMoO_6$, $(La0.7Sr0.3)MnO_3$, and NiMnSb. Because $Fe_3O_4$ has high resistivity, a thin coating of $Fe_3O_4$ minimizes film resistance. Because the barrier resistance dominates the overall resistance of the single-barrier and dual-barrier spin-transfer stacks, the much smaller resistance of the $Fe_3O_4$ thin coating does not significantly degrade the tunneling magnetoresistance (TMR).

In exemplary alternative embodiments for each of the single-barrier spin-transfer stack device and the exemplary dual-barrier spin-transfer stack device of the present invention, a half-metallic material layer can replace all or some of the magnetic layers, including the pinned layers and the free layer. In yet additional alternative embodiments, the free layer can be coated with half-metallic materials with the caveat that the resulting free layer/half-metallic layer combination may become undesirably thick because each material deposition requires a minimum amount of thickness.

Still another exemplary embodiment of the present invention provides a spacer-barrier spin-transfer stack device having all or some of the magnetic layers replaced with a half-metallic material. Alternatively, thin coatings of half-metallic material(s) at the interfaces between the pinned layers and their adjacent barrier and spacer layers can be used in this exemplary embodiment of the present invention. The half-metallic material coatings (of the same or different half-metallic materials) are used on both pinned layers of the device for increasing the polarization of the spin current and thereby reducing the switching current.

Figure 5A:
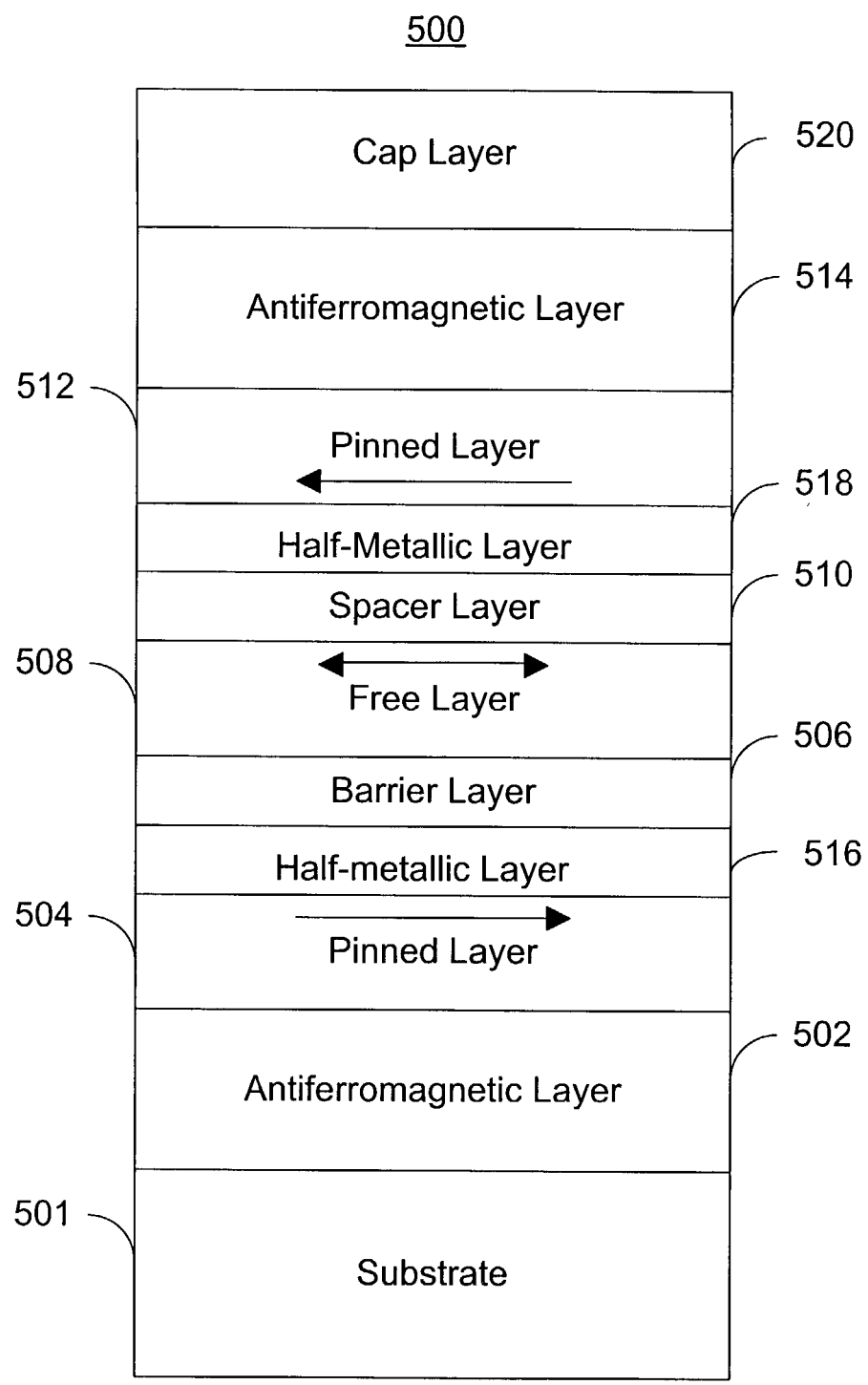
FIGS. 5A and 5B respectively depict cross sectional views of an exemplary barrier-spacer spin-transfer stack device and an exemplary spacer-barrier spin-transfer stack device according to the present invention.
Figure 5B:
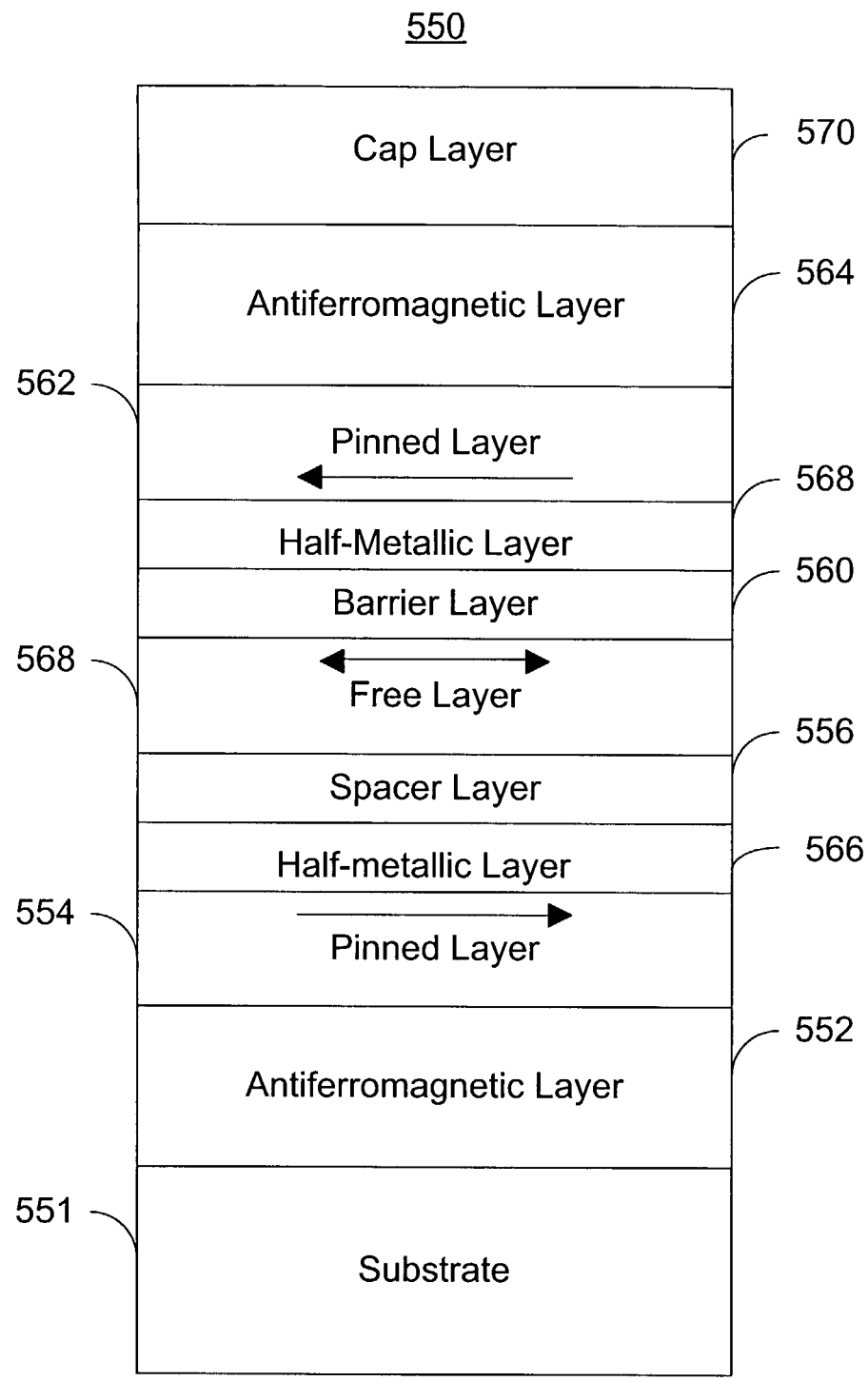

FIGS. 5A and 5B respectively depict cross sectional views of an exemplary barrier-spacer spin-transfer stack device 500 and an exemplary spacer-barrier spin-transfer stack device 550 according to the present invention. Device 500 is formed on a substrate 501 and includes a first antiferromagnetic (AFM1) layer 502, a first pinned layer 504, a tunneling barrier layer 506, a free layer 508, a spacer layer 510, a second pinned layer 512 and a second AFM (AFM2) layer 514. According to this exemplary embodiment of the invention, spacer-barrier spin-transfer stack device 500 includes a first half-metallic material layer 516 that has been formed between first pinned layer 504 and tunneling barrier layer 506 and is approximately 100 Å thick or less. A second half-metallic material layer 518 has also been formed between spacer layer 510 and second pinned layer 512, and is approximately 100 Å thick or less. One or both of half-metallic material layers 516 and 518 can be formed to be a continuous layer. Alternatively, one or both of half-metallic material layers 516 and 518 can be formed to be a discontinuous layer. Pinned layers 504 and 512, and free layer 508 are formed from a ferromagnetic or a ferrimagnetic material. Barrier layer 506 is formed from an insulator, such as alumina $Al_2O_3$ or other non-magnetic insulator, and has a thickness less than about 10 Å thereby allowing tunneling through barrier layer 506. The thickness of tunneling barrier layer 506 is adjusted so that the resistance across the tunneling barrier is sufficiently small. Spacer layer 510 is formed from a nonmagnetic, conductive material, such as Cu, Ag or Au, and is about 20–60 Å thick. AFM layers 502 and 514 are used to respectively fix, or pin, the magnetization of pinned layers 504 and 512 in a particular direction. The magnetization of free layer 508 is free to rotate, typically in response to an external field.

In FIG. 5B, device 550 is formed on a substrate 551 and includes a first antiferromagnetic (AFM1) layer 552, a first pinned layer 554, a spacer layer 556, a free layer 558, a tunnel barrier layer 560, a second pinned layer 562 and a second AFM (AFM2) layer 564. According to this exemplary embodiment of the invention, spacer-barrier spin-transfer stack device 550 includes a first half-metallic material layer 566 that has been formed between first pinned layer 554 and spacer layer 556 and is approximately 100 Å thick or less. A second half-metallic material layer 568 has also been formed between barrier layer 560 and second pinned layer 552, and is approximately 100 Å thick or less. One or both of half-metallic material layers 566 and 568 can be formed to be a continuous layer. Alternatively, one or both of half-metallic material layers 566 and 568 can be formed to be a discontinuous layer. Pinned layers 554 and 562, and free layer 558 are formed from a ferromagnetic or a ferrimagnetic material. Spacer layer 556 is formed from a nonmagnetic, conductive material, such as Cu, Ag or Au, and is about 20–60 Å thick. Barrier layer 560 is formed from an insulator, such as alumina $Al_2O_3$ or other non-magnetic insulator, and has a thickness less than about 10 Å thereby allowing tunneling through barrier layer 560. The thickness of tunneling barrier layer 560 is adjusted so that the resistance across the tunneling barrier is sufficiently small. AFM layers 552 and 564 are used to respectively fix, or pin, the magnetization of pinned layers 554 and 562 in a particular direction. The magnetization of free layer 558 is free to rotate, typically in response to an external field.

A suitable half-metallic material to use for half-metallic layer 516 of barrier-spacer of spin-transfer stack device 500 and for half-metallic layers 566 and 568 of spacer-barrier spin-transfer stack device 550 according to the present invention is $Fe_3O_4$, because $Fe_3O_4$ has high resistivity and can be used as a thin coating, thereby minimizing film resistance. The significantly smaller resistance of a $Fe_3O_4$ coating does not significantly degrade the TMR of the stack because the barrier resistance dominates the overall resistance of the spacer-barrier spin-transfer stack. Other suitable half-metallic materials that can be used include $CrO_2$, $Sr_2FeMoO_6$, $(La0.7Sr0.3)MnO_3$, and NiMnSb.

In an alternative embodiment for the exemplary spacer-barrier spin-transfer stack device of the present invention, a half-metallic material layer can replace all or some of the magnetic layers, including the pinned layers and the free layers. In yet an additional alternative embodiment, the free layer can be coated with half-metallic materials with the caveat that the resulting free layer/half-metallic layer combination may become undesirably thick because each material deposition requires a minimum amount of thickness.

Figure 1A:
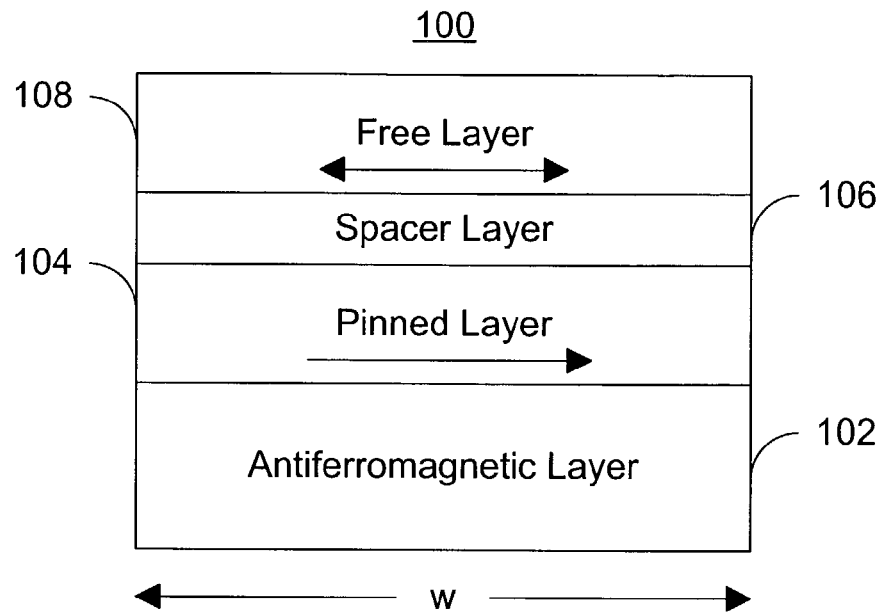
FIGS. 1A and 1B respectively depict cross sectional views of a conventional spin valve magnetic element and a conventional spin tunneling junction magnetic element.
Figure 1B:
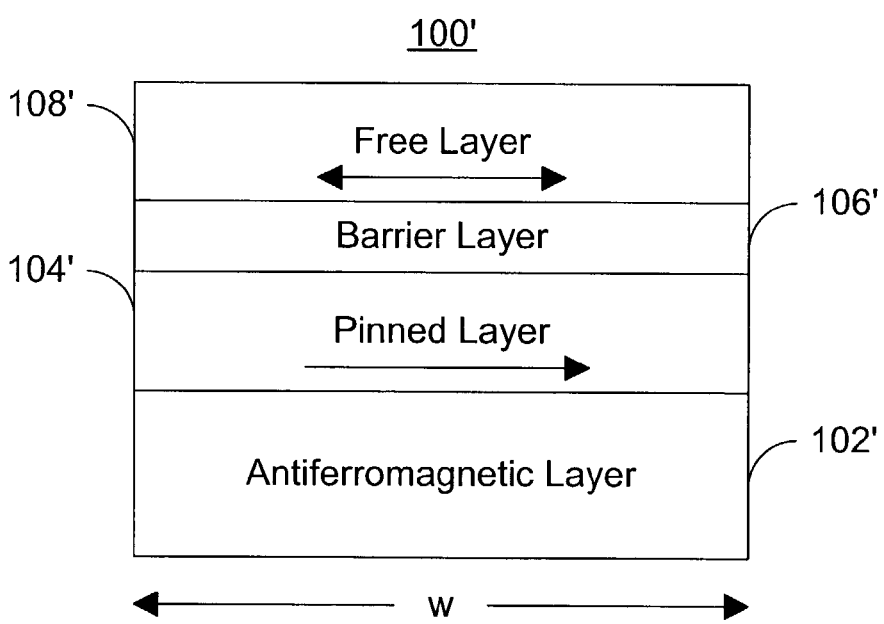
Figure 2:
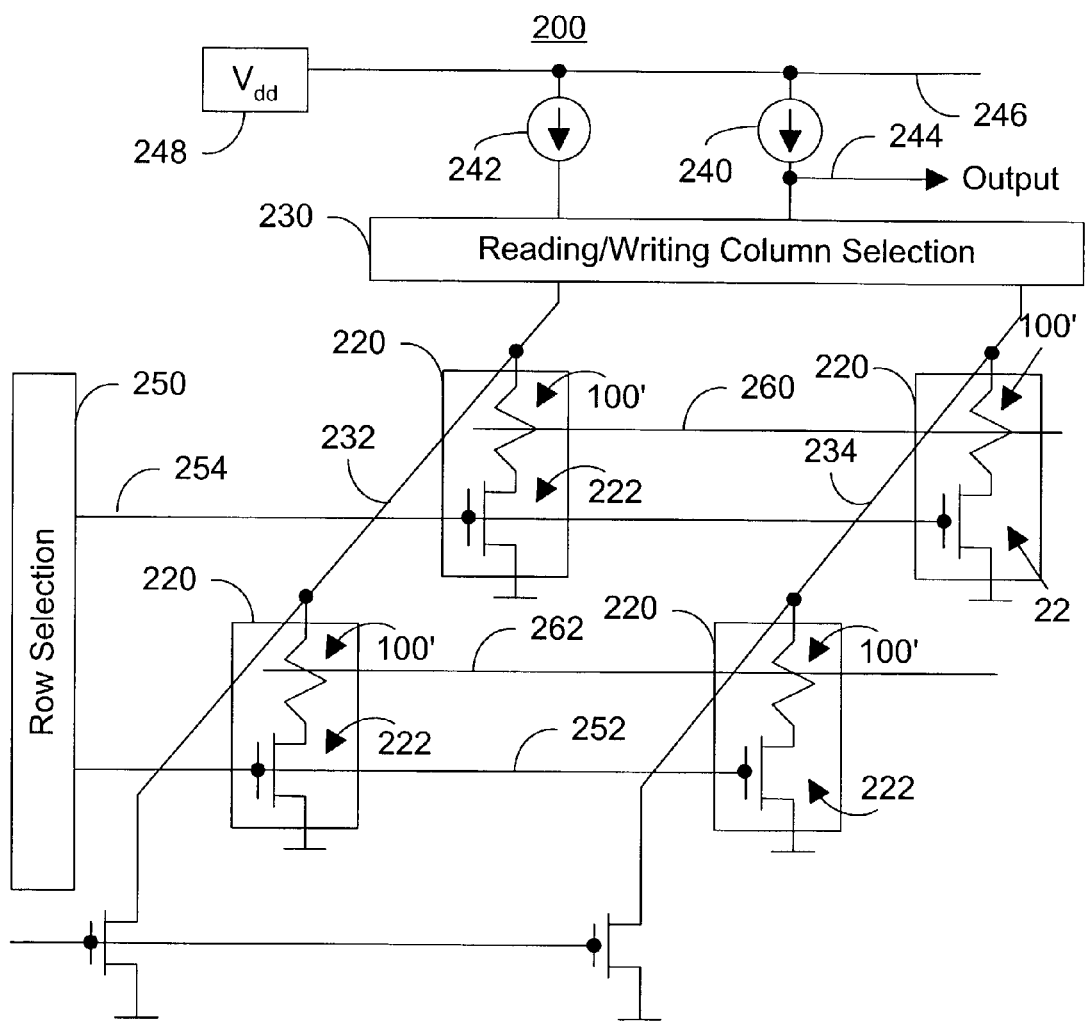
FIG. 2 depicts a conventional memory array using conventional memory cells.
Figure 6:
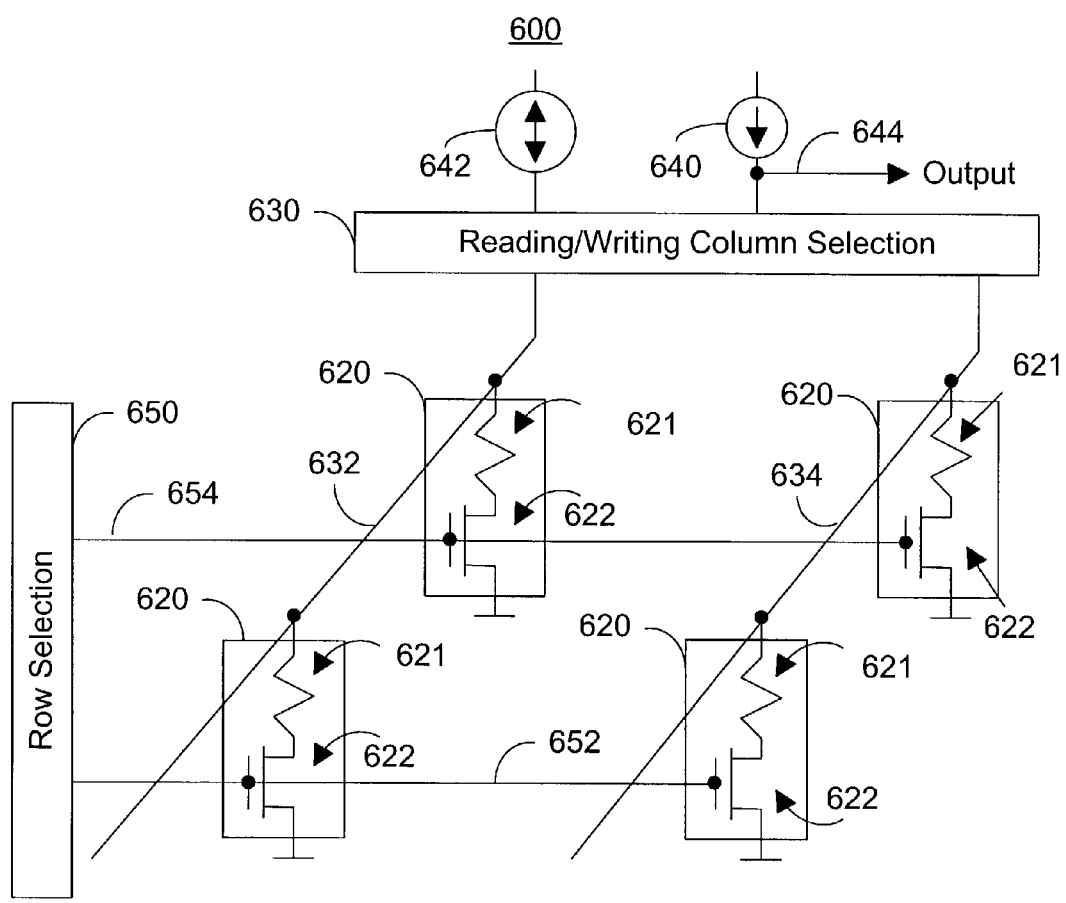
FIG. 6 depicts an exemplary embodiment of a magnetic memory array using memory cells having stack devices according to the present invention.

FIG. 6 depicts an exemplary embodiment of a magnetic memory array 600 using memory cells 620 according to the present invention. Memory array 600 is shown in FIG. 6 as having four memory cells 620. It should be understood that memory array 600 accordingly could have any number of memory cells 620. Each memory cell 620 includes a spin-transfer stack device according to the present invention, such as any of exemplary spin-transfer stack devices 300, 350, 400, 450, 500 and 550. As shown in FIG. 6, each memory cell 620 includes a spin-transfer stack device according to the present invention 621 and a transistor 622. Memory cells 620 are coupled to a reading/writing column selection 630 via bit lines 632 and 634 and to row selection 650 via word lines 652 and 654. Reading/writing column selection 630 is coupled to a write current source 642 and a read current source 640. It should be noted that, unlike conventional MRAM memory arrays using conventional MRAM memory cells, such as array 200 depicted in FIG. 2, magnetic memory array 600 using spin-transfer memory cells does not include any write lines. The omission of separate write lines should simplify the fabrication process and the supporting circuitry.

Figure 7:
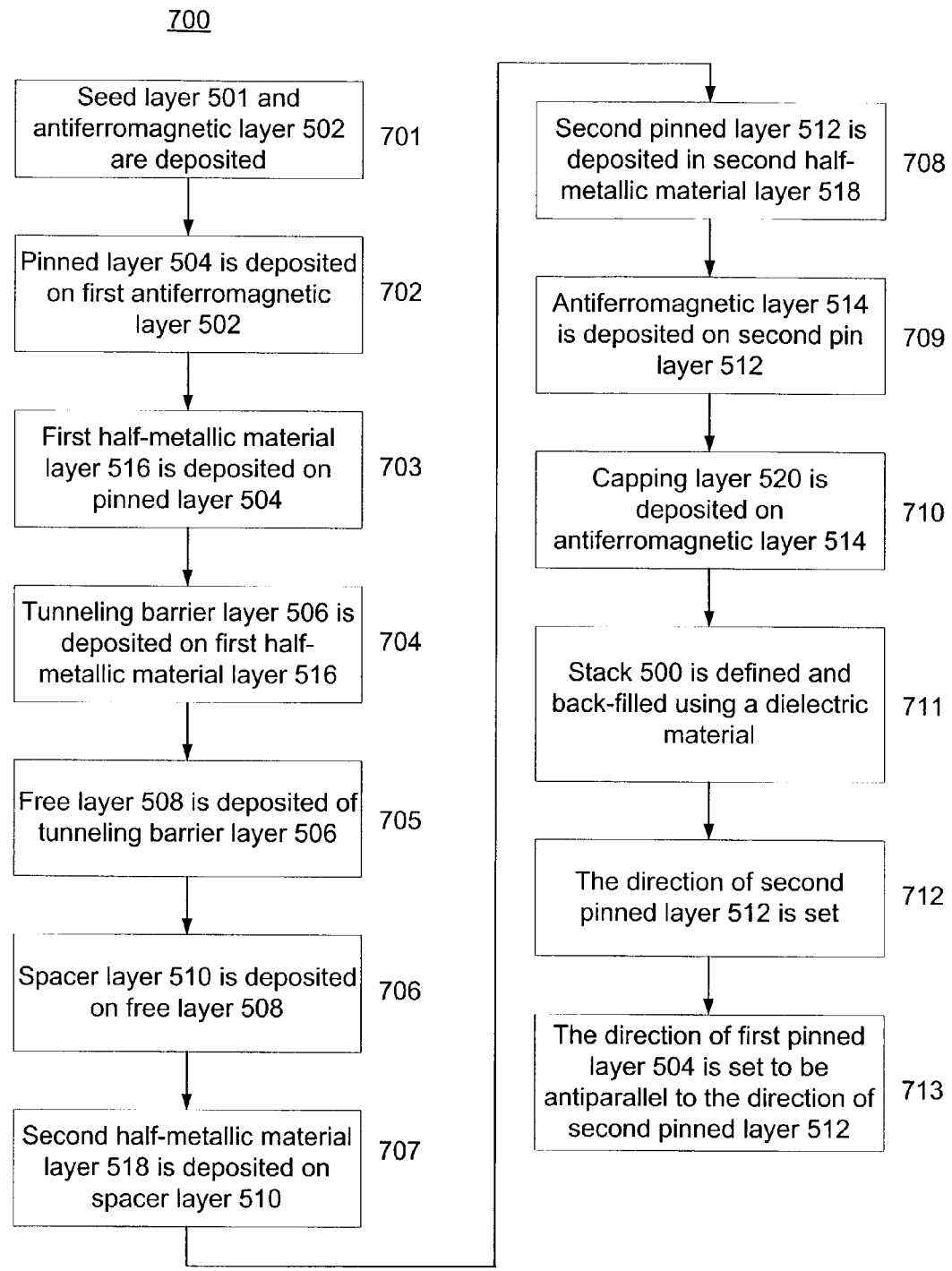
FIG. 7 shows a flow diagram for a process for producing the exemplary magnetic element memory cell having the spin-transfer stack device shown in FIG. 5A according to the present invention.

FIG. 7 shows a flow diagram 700 for a process for producing a magnetic element memory cell having a spin-transfer stack device, as shown in FIG. 5A, according to the present invention. The process is similar for the spin-transfer stack device shown in FIG. 5B, except that the steps 704 and 706 described below would be exchanged in order and the particular reference numerals for the different layers would correspond to the reference numerals of FIG. 5B. Additionally, the process for producing the spin-transfer stack devices of the present invention shown in FIGS. 3A, 3B, 4A and 4B should be readily apparent from the process shown in FIG. 7.

At step 701, a seed layer 501 is deposited in a well-known manner. First antiferromagnetic (AFM1) layer 502 is then deposited on seed layer 501 using a well-known technique, such as standard sputtering. First antiferromagnetic layer 502 is preferably formed to be about 200 Å thick and formed from, for example, IrMn having a setting temperature of T1 of approximately 200–250 degrees Celsius. At step 702, pinned layer 504 is deposited on first antiferromagnetic layer 502 using a well-known technique, such as using sputtered Co, CoFe, NiFe, CoNiFe, or other ferromagnetic alloys. Pinned layer 504 preferably has a thickness of about 100 Å. Alternatively, pinned layer 504 can be pinned in a well-known manner using shape anisotropy and/or high-coercivity material instead of using an antiferromagnetic layer.

At step 703, first half-metallic material layer 516 is deposited on pinned layer 504. Preferably, first half-metallic material layer 516 is formed from $Fe_3O_4$ and is between 50–200 Å thick. When first half-metallic material layer is formed using $Fe_3O_4$, the $Fe_3O_4$ coating can be RF-sputtered from a $Fe_3O_4$ target in Ar gas in a well-known manner. See, for example, S. Soeya, "Development of half-metallic ultrathin $Fe_3O_4$ films for spin-transport devices," Applied Physics Letters, Vol. 80, p. 823, 4 Feb. 2002. At step 704, tunneling barrier layer 506 is deposited on first half-metallic material layer 516 using a well-known technique. Tunneling barrier layer 506 can be formed from alumina $Al_2O_3$ or other non-magnetic insulator, and should have a thickness that is less than about 10 Å. The thickness of tunneling barrier layer 506 is adjusted so that the resistance across the tunneling barrier is sufficiently small.

At step 705, free layer 508 is deposited of tunneling barrier layer 506 using a well-known technique. Free layer 508 can be formed from Co, Ni, Fe, their respective alloys, such as, NiFe, CoFe or CoNiFe, or other ferromagnetic and ferrimagnetic materials. As previously mentioned, the free layer can also be formed from a half-metallic material. The thickness of free layer 508 is preferably less than about 20 Å, although such a small thickness may be difficult to achieve using a half-metallic material at this time. At step 706, spacer layer 510 is deposited on free layer 508 using a well-known technique. Spacer layer 510 can be formed from a layer of nonmagnetic, conductive material, such as Cu, Ag or Au, and is formed to be between about 20–60 Å thick. Alternatively, spacer layer 510 can be formed from a different non-magnetic conducting material, which has less interdiffusion with the pinned and free layers at high temperature (i.e., approximately 450 degrees Celsius).

At step 707, second half-metallic material layer 518 is deposited on spacer layer 510 using a well-known technique and in a similar manner as first half-metallic material layer 516, described in step 703. At step 708, second pinned layer 512 is deposited in second half-metallic material layer 518 using a well-known technique. Second pinned layer 512 can be deposited in a manner similar to that described in step 702.

At step 709, antiferromagnetic layer 514 is deposited on second pin layer 512 using a well-known technique. Antiferromagnetic layer 514 can be formed from PtMn, preferably has a thickness of about 160 Å, and has a different setting temperature T2>T1 from AFM1. Alternatively, pinned layer 512 can be pinned in a well-known manner using shape anisotropy and/or high coercivity material instead of using an antiferromagnetic layer. At step 710, a capping layer 520 is deposited on antiferromagnetic layer 514 using a well-known technique. Capping layer 520 (layer 570 for the device of FIG. 5B) can be formed from a layer of Ta that is about 30–50 Å thick. At step 711, stack 500 is then defined using a well-known manner, such as lithography, ion-milling or by etching the surrounding material, and then back-filling using a dielectric material, such as $SiO_2$, in a well-known manner.

At step 712, stack 500 is heated to a temperature that is approximately 300–320 degrees Celsius above setting temperatures T2 and T1 in the presence of a strong magnetic field of over 3000 Oe to set the direction of second pinned layer 512. At step 713, the direction of first pinned layer 504 is set to be antiparallel to the direction of second pinned layer 512 by heating stack 500 to a temperature that is approximately 200–220 degrees Celsius (above setting temperature T1, but below setting temperature T2) in the presence of a strong magnetic field of approximately 1000 Oe in the opposite direction as in step 712.

The present invention has been described in terms of a particular magnetic memory and a particular magnetic element having certain components. It should be readily recognized that the present invention will operate effectively for other magnetic memory elements having different and/or additional components and other magnetic memories having different and/or other features that are not inconsistent with the present invention. The present invention has also been described in the context of current understanding of the spin-transfer phenomenon. Consequently, it should be readily recognized that theoretical explanations of the behavior of the method and system are made based upon the current understanding of the spin-transfer phenomenon. Further, it should be readily recognized that the method and system of the present invention are described in the context of a structure having a particular relationship to a substrate. It should be recognized, however, that the method and system of the present invention are consistent with other structures. For example, the present invention is described in terms of a bottom spin valve (having a pinned layer at the bottom of the spin valve) combined with a top spin tunneling junction (having a pinned layer at the top of the spin tunneling junction). Accordingly, the present invention is also consistent with a top spin valve and a bottom spin tunneling junction. Additionally, the method and system of the present invention are described in the context of certain layers being synthetic. It should also be recognized that other and/or additional layers could be synthetic.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A magnetic element, comprising:
   a pinned layer and having a first magnetization that is pinned in a first direction;
   a half-metallic material layer formed on the pinned layer;
   a spacer layer formed on the half-metallic material layer, the spacer layer being nonmagnetic and conductive; and
   a free layer formed on the spacer layer, the free layer having a second magnetization that changes direction based on the spin-transfer effect when a write current passes through the magnetic element.

2. The magnetic element according to claim 1, wherein the pinned layer is formed from one of a ferromagnetic material and a ferrimagnetic material.

3. The magnetic element according to claim 1, wherein the pinned layer is formed from a half-metallic material;
   wherein the pinned layer and the half-metallic layer form a single layer; and
   wherein and the free layer is configured such that the second magnetization changes direction based on the spin-transfer effect when a write current passes through the magnetic element.

4. The magnetic element according to claim 3, wherein the half-metallic material layer forming the pinned layer is one of $Fe_3O_4$, $CrO_2$, $Sr_2FeMoO_6$, $(La0.7Sr0.3)MnO_3$, and NiMnSb.

5. The magnetic element according to claim 1, wherein the half-metallic material layer is formed from one of $Fe_3O_4$, $CrO_2$, $Sr_2FeMoO_6$, $(La0.7Sr0.3)MnO_3$, and NiMnSb.

6. The magnetic element according to claim 1, wherein the half-metallic material layer has a thickness that is less than about 100 Å.

7. The magnetic element according to claim 1, wherein the half-metallic material layer is a continuous layer on the pinned layer.

8. A magnetic element, comprising:
   a pinned layer and having a first magnetization that is pinned in a first direction;
   a half-metallic material layer formed on the pinned layer;
   a spacer layer formed on the half-metallic material layer, the spacer layer being nonmagnetic and conductive; and
   a free layer formed on the spacer layer, the free layer having a second magnetization that changes direction based on the spin-transfer effect when a write current passes through the magnetic element;
   wherein the half-metallic material layer is a discontinuous layer on the pinned layer.

9. The magnetic element according to claim 1, wherein the free layer is formed from one of a ferromagnetic material and a ferrimagnetic material.

10. The magnetic element according to claim 1, wherein the free layer is formed from a half-metallic material.

11. The magnetic element according to claim 10, wherein the half-metallic material layer forming the free layer is one of $Fe_3O_4$, $CrO_2$, $Sr_2FeMoO_6$, (La0.7Sr0.3)$MnO_3$, and NiMnSb.

12. A magnetic element, comprising:
  a pinned layer and having a first magnetization that is pinned in a first direction;
  a half-metallic material layer formed on the pinned layer;
  a spacer layer formed on the half-metallic material layer, the spacer layer being nonmagnetic and conductive; and
  a free layer formed on the spacer layer, the free layer having a second magnetization that changes direction based on the spin-transfer effect when a write current passes through the magnetic element;
  a second spacer layer formed on the free layer, the second spacer layer being nonmagnetic and conductive;
  a second half-metallic material layer formed on the second spacer layer; and
  a second pinned layer formed on the second half-metallic layer, the second pinned layer having a third magnetization that is pinned in a direction that is different from the first direction.

13. The magnetic element according to claim 12, wherein the second pinned layer is formed from one of a ferromagnetic material and a ferrimagnetic material.

14. The magnetic element according to claim 12, wherein the second pinned layer is formed from a half-metallic material, and
  wherein the second pinned layer and the second half-metallic layer form a single layer.

15. The magnetic element according to claim 14, wherein the half-metallic material layer forming the second pinned layer is one of $Fe_3O_4$, $CrO_2$, $Sr_2FeMoO_6$, (La0.7Sr0.3)$MnO_3$, and NiMnSb.

16. The magnetic element according to claim 12, wherein at least one half-metallic material layer is formed one of $Fe_3O_4$, $CrO_2$, $Sr_2FeMoO_6$, (La0.7Sr0.3)$MnO_3$, and NiMnSb.

17. The magnetic element according to claim 12, wherein at least one half-metallic material layer has a thickness that is less than about 100 Å.

18. The magnetic element according to claim 12, wherein at least one half-metallic material layer is formed as a continuous layer.

19. The magnetic element according to claim 12, wherein at least one half-metallic material layer is formed as a discontinuous layer.

20. A magnetic element, comprising:
  a pinned layer and having a first magnetization that is pinned in a first direction;
  a half-metallic material layer formed on the pinned layer;
  a spacer layer formed on the half-metallic material layer, the spacer layer being nonmagnetic and conductive; and
  a free layer formed on the spacer layer, the free layer having a second magnetization that changes direction based on the spin-transfer effect when a write current passes through the magnetic element;
  a barrier layer formed on the free layer, the barrier layer an insulator and having a thickness that allows tunneling through the barrier layer;
  a second half-metallic material layer formed on the barrier layer; and
  a second pinned layer formed on the second half-metallic layer, the second pinned layer having a third magnetization that is pinned in a direction that is different from the first direction.

21. The magnetic element according to claim 20, wherein the second pinned layer is formed from one of a ferromagnetic material and a ferrimagnetic material.

22. The magnetic element according to claim 20, wherein the second pinned layer is formed from a half-metallic material, and
  wherein the second pinned layer and the second half-metallic layer form a single layer.

23. The magnetic element according to claim 22, wherein the half-metallic material layer forming the second pinned layer is one of $Fe_3O_4$, $CrO_2$, $Sr_2FeMoO_6$, (La0.7Sr0.3)$MnO_3$, and NiMnSb.

24. The magnetic element according to claim 20, wherein at least one half-metallic material layer is formed one of $Fe_3O_4$, $CrO_2$, $Sr_2FeMoO_6$, (La0.7Sr0.3)$MnO_3$, and NiMnSb.

25. The magnetic element according to claim 20, wherein at least one half-metallic material layer has a thickness that is less than about 100 Å.

26. The magnetic element according to claim 20, wherein at least one half-metallic material layer is formed as a continuous layer.

27. The magnetic element according to claim 20, wherein at least one half-metallic material layer is formed as a discontinuous layer.

28. A magnetic memory device, comprising:
  a plurality of magnetic cells including a plurality of magnetic elements, at least one magnetic element including,
    a pinned layer and having a first magnetization that is pinned in a first direction,
    a half-metallic material layer formed on the pinned layer,
    a spacer layer formed on the half-metallic material layer, the spacer layer being nonmagnetic and conductive, and
    a free layer formed on the spacer layer, the free layer having a second magnetization that changes direction based on the spin-transfer effect when a write current passes through the magnetic element;
  a plurality of rows lines coupled to the plurality of magnetic cells; and
  a plurality of column lines coupled to the plurality of magnetic cells, the plurality of row lines and the plurality of column lines selecting a portion of the plurality of magnetic cells for reading and writing.

29. The magnetic memory device according to claim 28, wherein at least one pinned layer of at least one magnetic element is formed from one of a ferromagnetic material and a ferrimagnetic material.

30. The magnetic memory device according to claim 28, wherein at least one pinned layer of at least one magnetic element is formed from a half-metallic material;
  wherein the pinned layer and the half-metallic layer form a single layer; and
  wherein and the free layer is configured such that the second magnetization changes direction based on the spin-transfer effect when a write current passes through the magnetic element.

31. The magnetic memory device according to claim 30, wherein at least one half-metallic material layer forming at least one pinned layer of at least one magnetic element is one of $Fe_3O_4$, $CrO_2$, $Sr_2FeMoO_6$, $(La0.7Sr0.3)MnO_3$, and NiMnSb.

32. The magnetic memory device according to claim 28, wherein at least one half-metallic material layer of at least one magnetic element is formed from one of $Fe_3O_4$, $CrO_2$, $Sr_2FeMoO_6$, $(La0.7Sr0.3)MnO_3$, and NiMnSb.

33. The magnetic memory device according to claim 28, wherein at least one half-metallic material layer of at least one magnetic element has a thickness that is less than about 100 Å.

34. The magnetic memory device according to claim 28, wherein at least one half-metallic material layer of at least one magnetic element is a continuous layer.

35. A magnetic memory device, comprising:
a plurality of magnetic cells including a plurality of magnetic elements, at least one magnetic element including,
a pinned layer and having a first magnetization that is pinned in a first direction,
a half-metallic material layer formed on the pinned layer,
a spacer layer formed on the half-metallic material layer, the spacer layer being nonmagnetic and conductive, and
a free layer formed on the spacer layer, the free layer having a second magnetization that changes direction based on the spin-transfer effect when a write current passes through the magnetic element;
a plurality of rows lines coupled to the plurality of magnetic cells; and
a plurality of column lines coupled to the plurality of magnetic cells, the plurality of row lines and the plurality of column lines selecting a portion of the plurality of magnetic cells for reading and writing;
wherein at least one half-metallic material layer of at least one magnetic element is a discontinuous layer.

36. The magnetic memory device according to claim 28, wherein at least one free layer is formed from one of a ferromagnetic material and a ferrimagnetic material.

37. The magnetic memory device according to claim 28, wherein the free layer is formed from a half-metallic material.

38. The magnetic memory device according to claim 37, wherein the half-metallic material layer forming the free layer is one of $Fe_3O_4$, $CrO_2$, $Sr_2FeMoO_6$, $(La0.7Sr0.3)MnO_3$, and NiMnSb.

39. A magnetic memory device, comprising:
a plurality of magnetic cells including a plurality of magnetic elements, at least one magnetic element including,
a pinned layer and having a first magnetization that is pinned in a first direction,
a half-metallic material layer formed on the pinned layer,
a spacer layer formed on the half-metallic material layer, the spacer layer being nonmagnetic and conductive, and
a free layer formed on the spacer layer, the free layer having a second magnetization that changes direction based on the spin-transfer effect when a write current passes through the magnetic element;
a plurality of rows lines coupled to the plurality of magnetic cells; and
a plurality of column lines coupled to the plurality of magnetic cells, the plurality of row lines and the plurality of column lines selecting a portion of the plurality of magnetic cells for reading and writing;
wherein at least one magnetic element further includes:
a second spacer layer formed on the free layer, the second spacer layer being nonmagnetic and conductive;
a second half-metallic material layer formed on the second spacer layer; and
a second pinned layer formed on the second half-metallic layer, the second pinned layer having a third magnetization that is pinned in a direction that is different from the first direction.

40. The magnetic memory device according to claim 39, wherein at least one second pinned layer of at least one magnetic element is formed from one of a ferrimagnetic material and a ferrimagnetic material.

41. The magnetic element according to claim 39, wherein at least one second pinned layer of at least one magnetic element is formed from a half-metallic material, and
wherein the second pinned layer and the second half-metallic layer form a single layer.

42. The magnetic element according to claim 41, wherein the half-metallic material layer forming the second pinned layer is one of $Fe_3O_4$, $CrO_2$, $Sr_2FeMoO_6$, $(La0.7Sr0.3)MnO_3$, and NiMnSb.

43. The magnetic memory device according to claim 39, wherein at least one half-metallic material layer of at least one magnetic element is formed from one of $Fe_3O_4$, $CrO_2$, $Sr_2FeMoO_6$, $(La0.7Sr0.3)MnO_3$, and NiMnSb.

44. The magnetic memory device according to claim 39, wherein at least one half-metallic material layer of at least one magnetic element has a thickness that is less than about 100 Å.

45. The magnetic memory device according to claim 39, wherein at least one half-metallic material layer of at least one magnetic element is formed as a continuous layer.

46. The magnetic memory device according to claim 39, wherein at least one half-metallic material layer of at least one magnetic element is formed as a discontinuous layer.

47. A magnetic memory device, comprising:
a plurality of magnetic cells including a plurality of magnetic elements, at least one magnetic element including,
a pinned layer and having a first magnetization that is pinned in a first direction,
a half-metallic material layer formed on the pinned layer,
a spacer layer formed on the half-metallic material layer, the spacer layer being nonmagnetic and conductive, and
a free layer formed on the spacer layer, the free layer having a second magnetization that changes direction based on the spin-transfer effect when a write current passes through the magnetic element;
a plurality of rows lines coupled to the plurality of magnetic cells; and
a plurality of column lines coupled to the plurality of magnetic cells the plurality of row lines and the plurality of column lines selecting a portion of the plurality of magnetic cells for reading and writing;
wherein at least one magnetic element further includes:
a barrier layer formed on the free layer, the barrier layer an insulator and having a thickness that allows tunneling through the barrier layer;
a second half-metallic material layer formed on the barrier layer; and a second pinned layer formed on the second half-metallic layer, the second pinned layer having a third magnetization that is pinned in a direction that is different from the first direction.

48. The magnetic memory device according to claim 47, wherein at least one pinned layer of at least one magnetic element is formed from one of a ferromagnetic material and a ferrimagnetic material.

49. The magnetic memory device according to claim 47, wherein the second pinned layer of at least one magnetic element is formed from a half-metallic material, and
wherein the second pinned layer and the second half-metallic layer of the magnetic element form a single layer.

50. The magnetic memory device according to claim 49, wherein the half-metallic material layer forming the second pinned layer is one of $Fe_3O_4$, $CrO_2$, $Sr_2FeMoO_6$, $(La0.7Sr0.3)MnO_3$, and NiMnSb.

51. The magnetic memory device according to claim 47, wherein at least one half-metallic material layer of at least one magnetic element is formed one of $Fe_3O_4$, $CrO_2$, $Sr_2FeMoO_6$, $(La0.7Sr0.3)MnO_3$, and NiMnSb.

52. The magnetic memory device according to claim 47, wherein at least one half-metallic material layer of at least one magnetic element has a thickness that is less than about 100 Å.

53. The magnetic memory device according to claim 47, wherein at least one half-metallic material layer of at least one magnetic element is formed as a continuous layer.

54. The magnetic memory device according to claim 47, wherein at least one half-metallic material layer of at least one magnetic element is formed as a discontinuous layer.

55. A magnetic element, comprising:
a pinned layer and having a first magnetization that is pinned in a first direction;
a half-metallic material layer formed on the pinned layer;
a barrier layer formed on the half-metallic material layer, the barrier layer being an insulator and having a thickness that allows tunneling through the barrier layer; and
a free layer formed on the barrier layer, the free layer having a second magnetization that changes direction based on the spin-transfer effect when a write current passes through the magnetic element.

56. The magnetic element according to claim 55, wherein the pinned layer is formed from one of a ferromagnetic material and a ferrimagnetic material.

57. The magnetic element according to claim 55, wherein the pinned layer is formed from a half-metallic material;
wherein the pinned layer and the half-metallic layer form a single layer; and
wherein and the free layer is configured such that the second magnetization changes direction based on the spin-transfer effect when a write current passes through the magnetic element.

58. The magnetic element according to claim 57, wherein the half-metallic material layer forming the pinned layer is one of $Fe_3O_4$, $CrO_2$, $Sr_2FeMoO_6$, $(La0.7Sr0.3)MnO_3$, and NiMnSb.

59. The magnetic element according to claim 55, wherein the half-metallic material layer is formed from one of $Fe_3O_4$, $CrO_2$, $Sr_2FeMoO_6$, $(La0.7Sr0.3)MnO_3$, and NiMnSb.

60. The magnetic element according to claim 55, wherein the half-metallic material layer has a thickness that is less than about 100 Å.

61. The magnetic element according to claim 55, wherein the half-metallic material layer is a continuous layer on the pinned layer.

62. A magnetic element, comprising:
a pinned layer and having a first magnetization that is pinned in a first direction;
a half-metallic material layer formed on the pinned layer;
a barrier layer formed on the half-metallic material layer, the barrier layer being an insulator and having a thickness that allows tunneling through the barrier layer; and
a free layer formed on the barrier layer, the free layer having a second magnetization that changes direction based on the spin-transfer effect when a write current passes through the magnetic element;
wherein the half-metallic material layer is a discontinuous layer on the pinned layer.

63. The magnetic element according to claim 55, wherein the free layer is formed from one of a ferromagnetic material and a ferrimagnetic material.

64. The magnetic element according to claim 55, wherein the free layer is formed from a half-metallic material.

65. The magnetic element according to claim 64, wherein the half-metallic material layer forming the free layer is one of $Fe_3O_4$, $CrO_2$, $Sr_2FeMoO_6$, $(La0.7Sr0.3)MnO_3$, and NiMnSb.

66. A magnetic element, comprising:
a pinned layer and having a first magnetization that is pinned in a first direction;
a half-metallic material layer formed on the pinned layer;
a barrier layer formed on the half-metallic material layer, the barrier layer being an insulator and having a thickness that allows tunneling through the barrier layer;
a free layer formed on the barrier layer, the free layer having a second magnetization that changes direction based on the spin-transfer effect when a write current passes through the magnetic element;
a second barrier layer formed on the free layer, the second barrier layer an insulator and having a thickness that allows tunneling through the second barrier layer;
a second half-metallic material layer formed on the second barrier layer; and
a second pinned layer formed on the second half-metallic layer, the second pinned layer having a third magnetization that is pinned in a direction that is different from the first direction.

67. The magnetic element according to claim 66, wherein the second pinned layer is formed from one of a ferromagnetic material and a ferrimagnetic material.

68. The magnetic element according to claim 66, wherein the second pinned layer is formed from a half-metallic material, and
wherein the second pinned layer and the second half-metallic layer form a single layer.

69. The magnetic element according to claim 68, wherein the half-metallic material layer forming the second pinned layer is one of $Fe_3O_4$, $CrO_2$, $Sr_2FeMoO_6$, $(La0.7Sr0.3)MnO_3$, and NiMnSb.

70. The magnetic element according to claim 66, wherein at least one half-metallic material layer is formed one of $Fe_3O_4$, $CrO_2$, $Sr_2FeMoO_6$, $(La0.7Sr0.3)MnO_3$, and NiMnSb.

71. The magnetic element according to claim 66, wherein at least one half-metallic material layer has a thickness that is less than about 100 Å.

72. The magnetic element according to claim 66, wherein at least one half-metallic material layer is formed as a continuous layer.

73. The magnetic element according to claim 66, wherein at least one half-metallic material layer is formed as a discontinuous layer.

74. A magnetic element, comprising:
a pinned layer and having a first magnetization that is pinned in a first direction;
a half-metallic material layer formed on the pinned layer;
a barrier layer formed on the half-metallic material layer, the barrier layer being an insulator and having a thickness that allows tunneling through the barrier layer;
a free layer formed on the barrier layer, the free layer having a second magnetization that changes direction based on the spin-transfer effect when a write current passes through the magnetic element;
a spacer layer formed on the free layer, the spacer layer being nonmagnetic and conductive;
a second half-metallic material layer formed on the spacer layer; and
a second pinned layer formed on the second half-metallic layer, the second pinned layer having a third magnetization that is pinned in a direction that is different from the first direction.

75. The magnetic element according to claim 74, wherein the second pinned layer is formed from one of a ferromagnetic material and a ferrimagnetic material.

76. The magnetic element according to claim 74, wherein the second pinned layer is formed from a half-metallic material, and
wherein the second pinned layer and the second half-metallic layer form a single layer.

77. The magnetic element according to claim 76, wherein the half-metallic material layer forming the second pinned layer is one of $Fe_3O_4$, $CrO_2$, $Sr_2FeMoO_6$, (La0.7Sr0.3)MnO$_3$, and NiMnSb.

78. The magnetic element according to claim 74, wherein at least one half-metallic material layer is formed one of $Fe_3O_4$, $CrO_2$, $Sr_2FeMoO_6$, (La0.7Sr0.3)MnO$_3$, and NiMnSb.

79. The magnetic element according to claim 74, wherein at least one half-metallic material layer has a thickness that is less than about 100 Å.

80. The magnetic element according to claim 74, wherein at least one half-metallic material layer is formed as a continuous layer.

81. The magnetic element according to claim 74, wherein at least one half-metallic material layer is formed as a discontinuous layer.

82. A magnetic memory device, comprising:
a plurality of magnetic cells including a plurality of magnetic elements, at least one magnetic element including,
a pinned layer and having a first magnetization that is pinned in a first direction,
a half-metallic material layer formed on the pinned layer,
a spacer layer formed on the half-metallic material layer, the spacer layer being nonmagnetic and conductive, and
a free layer formed on the spacer layer, the free layer having a second magnetization that changes direction based on the spin-transfer effect when a write current passes through the magnetic element;
a plurality of rows lines coupled to the plurality of magnetic cells; and
a plurality of column lines coupled to the plurality of magnetic cells, the plurality of row lines and the plurality of column lines selecting a portion of the plurality of magnetic cells for reading and writing.

83. The magnetic memory device according to claim 82, wherein at least one pinned layer of at least one magnetic element is formed from one of a ferromagnetic material and a ferrimagnetic material.

84. The magnetic memory device according to claim 82, wherein at least one pinned layer of at least one magnetic element is formed from a half-metallic material;
wherein the pinned layer and the half-metallic layer form a single layer; and
wherein and the free layer is configured such that the second magnetization changes direction based on the spin-transfer effect when a write current passes through the magnetic element.

85. The magnetic memory device according to claim 82, wherein at least one half-metallic material layer forming at least one pinned layer of at least one magnetic element is one of $Fe_3O_4$, $CrO_2$, $Sr_2FeMoO_6$, (La0.7Sr0.3)MnO$_3$, and NiMnSb.

86. The magnetic memory device according to claim 82, wherein at least one half-metallic material layer of at least one magnetic element is formed from one of $Fe_3O_4$, $CrO_2$, $Sr_2FeMoO_6$, (La0.7Sr0.3)MnO$_3$, and NiMnSb.

87. The magnetic memory device according to claim 82, wherein at least one half-metallic material layer of at least one magnetic element has a thickness that is less than about 100 Å.

88. The magnetic memory device according to claim 82, wherein at least one half-metallic material layer of at least one magnetic element is a continuous layer.

89. A magnetic memory device, comprising:
a plurality of magnetic cells including a plurality of magnetic elements, at least one magnetic element including
a pinned layer and having a first magnetization that is pinned in a first direction,
a half-metallic material layer formed on the pinned layer,
a spacer layer formed on the half-metallic material layer, the spacer layer being nonmagnetic and conductive, and
a free layer formed on the spacer layer, the free layer having a second magnetization that changes direction based on the spin-transfer effect when a write current passes through the magnetic element;
a plurality of rows lines coupled to the plurality of magnetic cells; and
a plurality of column lines coupled to the plurality of magnetic cells, the plurality of row lines and the plurality of column lines selecting a portion of the plurality of magnetic cells for reading and writing;
wherein at least one half-metallic material layer of at least one magnetic element is a discontinuous layer.

90. The magnetic memory device according to claim 82, wherein at least one free layer of at least one magnetic element is formed from one of a ferromagnetic material and a ferrimagnetic material.

91. The magnetic memory device according to claim 90, wherein at least one free layer of at least one magnetic element is formed from a half-metallic material.

92. The magnetic memory device according to claim 82, wherein at least one half-metallic material layer of at least one magnetic element is formed from one of $Fe_3O_4$, $CrO_2$, $Sr_2FeMoO_6$, (La0.7Sr0.3)MnO$_3$, and NiMnSb.

93. A magnetic memory device, comprising:
a plurality of magnetic cells including a plurality of magnetic elements, at least one magnetic element including, a pinned layer and having a first magnetization that is pinned in a first direction, a half-metallic material layer formed on the pinned layer, a spacer layer formed on the half-metallic material layer, the spacer layer being nonmagnetic and conductive, and a free layer formed on the spacer layer, the free layer having a second magnetization that changes direction based on the spin-transfer effect when a write current passes through the magnetic element;

a plurality of rows lines coupled to the plurality of magnetic cells;

a plurality of column lines coupled to the plurality of magnetic cells, the plurality of row lines and the plurality of column lines selecting a portion of the plurality of magnetic cells for reading and writing;

wherein at least one magnetic element further includes:

a second barrier layer formed on the free layer, the barrier layer being an insulator and having a thickness that allows tunneling through the barrier layer;

a second half-metallic material layer formed on the second barrier layer; and a second pinned layer formed on the second half-metallic layer, the second pinned layer having a third magnetization that is pinned in a direction that is different from the first direction.

94. The magnetic memory device according to claim 93, wherein the second pinned layer is formed from one of a ferromagnetic material and a ferrimagnetic material.

95. The magnetic memory device according to claim 93, wherein the second pinned layer is formed from a half-metallic material, and wherein the second pinned layer and the second half-metallic layer form a single layer.

96. The magnetic memory device according to claim 95, wherein the half-metallic material layer forming the second pinned layer is one of $Fe_3O_4$, $CrO_2$, $Sr_2FeMoO_6$, $(La0.7Sr0.3)MnO_3$, and NiMnSb.

97. The magnetic memory device according to claim 93, wherein at least one half-metallic material layer of at least one magnetic element is formed from one of $Fe_3O_4$, $CrO_2$, $Sr_2FeMoO_6$, $(La0.7Sr0.3)MnO_3$, and NiMnSb.

98. The magnetic memory device according to claim 93, wherein at least one half-metallic material layer of at least one magnetic element has a thickness that is less than about 100 Å.

99. The magnetic memory device according to claim 93, wherein at least one half-metallic material layer of at least one magnetic element is formed as a continuous layer.

100. The magnetic memory device according to claim 93, wherein at least one half-metallic material layer of at least one magnetic element is formed as a discontinuous layer.

101. A magnetic memory device, comprising:

a plurality of magnetic cells including a plurality of magnetic elements, at least one magnetic element including, a pinned layer and having a first magnetization that is pinned in a first direction, a half-metallic material layer formed on the pinned layer, a spacer layer formed on the half-metallic material layer, the spacer layer being nonmagnetic and conductive, and a free layer formed on the spacer layer, the free layer having a second magnetization that changes direction based on the spin-transfer effect when a write current passes through the magnetic element;

a plurality of rows lines coupled to the plurality of magnetic cells; and a plurality of column lines coupled to the plurality of magnetic cells, the plurality of row lines and the plurality of column lines selecting a portion of the plurality of magnetic cells for reading and writing, wherein the at least one magnetic element further includes:

a spacer layer formed on the free layer, the spacer layer being nonmagnetic and conductive;

a second half-metallic material layer formed on the spacer layer; and a second pinned layer formed on the second half-metallic layer, the second pinned layer having a third magnetization that is pinned in a direction that is different from the first direction.

102. The magnetic memory device according to claim 100, wherein the second pinned layer is formed from one of a ferromagnetic material and a ferrimagnetic material.

103. The magnetic memory device according to claim 93, wherein the second pinned layer is formed from a half-metallic material, and wherein the second pinned layer and the second half-metallic layer form a single layer.

104. The magnetic memory device according to claim 103, wherein the half-metallic material layer forming the second pinned layer is one of $Fe_3O_4$, $CrO_2$, $Sr_2FeMoO_6$, $(La0.7Sr0.3)MnO_3$, and NiMnSb.

105. The magnetic memory device according to claim 93, wherein at least one half-metallic material layer of at least one magnetic element is formed from one of $Fe_3O_4$, $CrO_2$, $Sr_2FeMoO_6$, $(La0.7Sr0.3)MnO_3$, and NiMnSb.

106. The magnetic memory device according to claim 93, wherein at least one half-metallic material layer of at least one magnetic element has a thickness that is less than about 100 Å.

107. The magnetic memory device according to claim 93, wherein at least one half-metallic material layer of at least one magnetic element is formed as a continuous layer.

108. The magnetic memory device according to claim 93, wherein at least one half-metallic material layer of at least one magnetic element is formed as a discontinuous layer.

* * * * *